ial Power Amplifier with Double Nested Miller Compensation", IEEE, Journal of Solid State Circuits, vol. 28, No. 7 (1993) N.Y., U.S.A.

United States Patent [19]
Thomsen

[11] Patent Number: 6,002,299
[45] Date of Patent: Dec. 14, 1999

[54] HIGH-ORDER MULTIPATH OPERATIONAL AMPLIFIER WITH DYNAMIC OFFSET REDUCTION, CONTROLLED SATURATION CURRENT LIMITING, AND CURRENT FEEDBACK FOR ENHANCED CONDITIONAL STABILITY

[75] Inventor: Axel Thomsen, Austin, Tex.

[73] Assignee: Cirrus Logic, Inc., Fremont, Calif.

[21] Appl. No.: 08/872,424

[22] Filed: Jun. 10, 1997

[51] Int. Cl.[6] ................................ H03F 1/02; H03F 1/36
[52] U.S. Cl. ................................ 330/9; 330/107
[58] Field of Search ................ 330/9, 107, 109, 330/129, 149, 151, 292; 327/307, 124

[56] References Cited

U.S. PATENT DOCUMENTS

| | | | |
|---|---|---|---|
| 3,989,961 | 11/1976 | Masreliez | 307/261 |
| 3,991,730 | 11/1976 | Crall | 123/117 |
| 4,318,613 | 3/1982 | Waiwood | 355/68 |
| 4,384,257 | 5/1983 | Nola | 328/127 |
| 4,429,281 | 1/1984 | Ito et al. | 330/9 |
| 4,502,020 | 2/1985 | Nelson et al. | 330/265 |
| 4,509,037 | 4/1985 | Harris | 340/347 |
| 4,559,502 | 12/1985 | Huijsing | 330/294 |
| 4,559,634 | 12/1985 | Hochschild | 375/9 |
| 4,628,279 | 12/1986 | Nelson | 330/257 |
| 4,713,628 | 12/1987 | Nelson | 330/254 |
| 4,757,270 | 7/1988 | Rokos | 330/103 |
| 4,757,275 | 7/1988 | Saller et al. | 330/261 |
| 4,766,367 | 8/1988 | Saller et al. | 323/315 |
| 4,780,689 | 10/1988 | Saller et al. | 330/267 |
| 4,808,942 | 2/1989 | Milkovic | 330/9 |
| 4,906,944 | 3/1990 | Frerking | 331/1 |
| 4,924,189 | 5/1990 | Senn et al. | 330/109 X |
| 4,926,178 | 5/1990 | Mallinson | 341/143 |
| 4,939,516 | 7/1990 | Early | 341/143 |
| 4,994,805 | 2/1991 | Dedic et al. | 341/143 |
| 5,012,244 | 4/1991 | Wellard et al. | 341/143 |
| 5,298,813 | 3/1994 | Tanigawa et al. | 330/107 X |
| 5,317,277 | 5/1994 | Cavigelli | 330/109 |
| 5,446,405 | 8/1995 | Ikeda | 330/9 X |
| 5,451,901 | 9/1995 | Welland | 330/133 |
| 5,477,481 | 12/1995 | Kerth | 364/825 |
| 5,635,871 | 6/1997 | Cavigelli | 330/107 |
| 5,798,664 | 8/1998 | Nagahori et al. | 330/259 X |

FOREIGN PATENT DOCUMENTS

| | | |
|---|---|---|
| 0736968 A2 | 9/1996 | United Kingdom . |
| 0736968 A3 | 1/1997 | United Kingdom . |

OTHER PUBLICATIONS

PCT International Search Report mailed Sep. 28, 1998 for PCT/US/98/11621.

Pernici, Sergio, "A CMOS Low–Distortion Fully Differential Power Amplifier with Double Nested Miller Compensation", IEEE, Journal of Solid State Circuits, vol. 28, No. 7 (1993) N.Y., U.S.A.

(List continued on next page.)

*Primary Examiner*—Steven J. Mottola
*Attorney, Agent, or Firm*—Arnold White & Durkee

[57] ABSTRACT

An amplifier is disclosed including at least three integrator stages connected to provide a low-frequency path from a signal input to a signal output, and a relatively high-frequency bypass path around the first integrator stage. The first integrator stage uses dynamic offset reduction such as chopper stabilization, and an analog low-pass filter reduces artifacts of the dynamic offset reduction. The paths converge at a current summing node. To prevent instability when the integrators are saturated by large signals, the paths have respective saturation current limits selected so that the relatively high-frequency path is not saturated when the low-frequency path saturates. To ensure that the conditional stability is substantially unaffected by adjustment of closed-loop gain, a current feedback input adjusts the open-loop gain in a fashion inversely proportional to resistance presented to the current feedback input by a feedback circuit.

89 Claims, 17 Drawing Sheets

OTHER PUBLICATIONS

Kuo Chiang Hsieh et al., A Low–Noise Chopper–Stabilized Differential Switched–Capacitor Filtering Technique, IEEE Journal of Solid–State Circuits, vol. SC–16, No. 6, Dec. 1981, pp. 708–715.

Alan B. Grebene, Analog Integrated Circuit Design, Van Nostrand Reinhold Co., New York, N.Y., 1972, p. 155–170.

Ralph J. Schwarz et al., Linear Systems, Mc Graw–Hill Book Co., New York, N.Y., 1965, pp. 422–429.

Floyd M. Gardner, Phaselock Techniques, 2nd Edition, Wiley–Interscience, 1979, pp. 16–25.

Wai L. Lee et al., A Topology for Higher Order Interpolative Coders, IEEE, 1987, pp. 459–462.

Wai Laing Lee, A Novel Higher Order Interpolative Modulator Topology for High Resolution Oversampling A/D Converters, Master's Thesis, Massachusetts Institute of Technology, Boston, Mass., 1987, pp. 1–135.

Sergio Franco, Design With Operational Amplifiers and Analog Integrated Circuits, McGraw–Hill Book Co., New York, N.Y., 1988, pp. 264–291.

Frank N. L. Op't Eynde, A CMOS Large–Swing Low–Distortion Three–Stage Class AB Power Amplifier, IEEE Journal of Solid–State Circuits, vol. 25, No. 1, Feb. 1990, pp. 265–273.

Ruud G.H. Eschauzier, et al., A 100–Mhz 100–dB Operational Amplifier with Multipath Nested Miller Compensation Structure, IEEE Journal of Solid–State Circuits, vol. 27, No. 12, Dec. 1992, pp. 1709–1716.

Paul C. Yu et al., A High–Swing 2–V CMOS Operational Amplifier with Replica–Amp Gain Enhancement, IEEE Journal of Solid–State Circuits, vol. 28, No. 12, Dec. 1993, pp. 1265–1272.

Rudy G. H. Eschauzier et al., Frequency Compensation Techniques for Low–Power Operational Amplifiers, Klluwer Academic Publishers, Boston, Mass., 1995 (entire book).

Iuri Mehr et al., Discrete–Time Feedback Structures for High Precision Analog Signal Processing, IEEE Transactions on Circuits and Systems–II: Analog and Digital Signal Processing, vol. 43, No. 1, Jan. 1996, pp. 60–62.

Christian C. Enz et al., Circuit Techniques for Reducing the Effects of Op–Amp Imperfections: Autozeroing, Correlated Double Sampling, and Chopper Stabilization, Proceedings of the IEEE, vol. 84, No. 11, Nov. 1996, pp. 1584–1614.

Steven R. Norsworthy et al., Delta–Sigma Data Converters Theory, Design, and Simulation, IEEE Press, 1997, pp. 183–185.

Fan You et al., A Multistage Amplifier Topology with Nested Gm–C Compensation for Low–Voltage Application, ISSCC, Feb. 8, 1997, 2 pages.

Topics on Using the LM6181—A New Current Feedback Amplifier, National Semiconductor Application Note 813, Mar. 1992, pp. 1–10.

Robert J. Widlar, New Op Amp Ideas, National Semiconductor Application Note 211, Dec. 1978, pp. 1–18.

Robert J. Widlar, Applying a New Precision Op Amp, National Semiconductor Application Note 242, Apr. 1980, pp. 1–16.

6,002,299

HIGH-ORDER MULTIPATH OPERATIONAL AMPLIFIER WITH DYNAMIC OFFSET REDUCTION, CONTROLLED SATURATION CURRENT LIMITING, AND CURRENT FEEDBACK FOR ENHANCED CONDITIONAL STABILITY

BACKGROUND OF THE INVENTION

1. Field of the Invention

The invention relates to conditionally-stable operational amplifiers.

2. Description of the Related Art

An operational amplifier is a relatively high gain amplifier capable of being used in various kinds of feedback circuits for performing certain mathematical operations. For example, operational amplifier circuits can provide programmable gain, signal summation, integration, and differentiation, and various other useful functions too numerous to mention here.

The most popular variety of operational amplifier has high-impedance differential signal inputs and a low impedance signal output, and functions as a high-gain differential voltage amplifier. Another kind of operational amplifier, known as an "operational transconductance amplifier," has high-impedance differential signal inputs and a high-impedance signal output, and functions as a differential voltage to current converter.

High accuracy operational amplifier circuits require large gain from zero frequency up to a certain closed-loop bandwidth. Most general-purpose operational amplifiers are constructed with a dominant pole in the open-loop frequency response in order to guarantee stability when any purely resistive voltage divider provides a feedback signal. When the operational amplifier has such an open-loop frequency response, an enormous gain-bandwidth product is required for high accuracy. Therefore, designers of low-power or high-accuracy operational amplifier circuits have considered conditional stability as a way of avoiding the gain-bandwidth product limitation of unconditionally-stable operational amplifiers. A conditionally-stable operational amplifier has at least 180 degrees of phase lag for a frequency less than the frequency at which the operational amplifier has an open-loop unity gain, but the phase lag decreases to less than 180 degrees as the frequency increases to the open-loop unity gain frequency.

One circuit technique proposed for constructing a conditionally-stable operational amplifier is known as multipath conditionally-stable compensation. The multipath technique is introduced in Rudy Eschauzier and Johan H. Huijsing, *Frequency Compensation Techniques for Low-Power Operational Amplifiers*, Kluwer Academic Publishers, Boston, 1995, pp. 167–173. An operational amplifier using this technique includes a series of integrators, and each integrator includes a first transconductance stage, a second transconductance stage, and a capacitor connected from the input to the output of the second transconductance stage. The series of integrators forms a low-frequency path. Because a series of integrators has at least two integrators and each integrator in practice has slightly more than 90 degrees of phase shift, the series of integrators tends to be neither conditionally stable nor unconditionally stable. In order to make the operational amplifier conditionally stable, the operational amplifier further includes one or more high-frequency bypass paths around the integrators in order to "roll back" the phase shift to less than 180 degrees as the frequency reaches the open-loop unity gain frequency. The bypass path includes a transconductance bypass stage having an input driven by an input of the operational amplifier and an output connected to the second or higher integrator in the series. The output of the transconductance bypass stage is connected to the node interconnecting the first transconductor output, the second transconductance input, and the capacitor of the second or higher integrator in the series. Each integrator stage has a unity-gain frequency (in radians per second) equal to the ratio of the transconductance of its first stage divided by the capacitance of its capacitor. In order for the bypass stage to "roll back" the phase lag, the ratio of the transconductance of the bypass stage to the capacitance of the capacitor to which the bypass stage output is connected must be substantially less than the open-loop unity gain frequency (in radians per second). For a high-order multipath operational amplifier having three integrators, for example, each integrator has the same unity gain frequency, and there are two bypass transconductors, each of which has a take-over frequency (i.e., ratio of the transconductance to the capacitance connected to the bypass transconductor output) that is about one-fifth of the open-loop unity gain frequency.

In practice, a number of related problems have been discovered during the design of a conditionally-stable high-order multi-path operational amplifier. A first problem is the voltage offset and 1/f noise in the low-frequency path. For a high-accuracy operational amplifier, it is desired to have a relatively low voltage offset and low 1/f noise.

A second problem is instability caused when the integrators become saturated by large signals or transients. When an integrator saturates, its open-loop frequency response is changed, so it is possible for the operational amplifier to become unstable.

A third problem is the limited range of closed-loop gain over which the conditionally-stable operational amplifier is stable, and the fact that this limited range of stability may prevent an integrated circuit design from being useful as a general-purpose building block for a variety of applications.

SUMMARY OF THE INVENTION

In accordance with one aspect of the invention, an amplifier has at least three integrator stages in a low-frequency path from a signal input to a signal output, and a relatively high-frequency bypass path from the signal input to the signal output for bypassing a first one of the integrator stages in the low-frequency path. The first one of the integrator stages includes a differential amplifier and a dynamic offset reduction circuit connected to the differential amplifier to provide a reduction in differential offset voltage of the first one of the integrator stages.

In accordance with another aspect of the invention, stability of a conditionally-stable operational amplifier is ensured against large signals and transients by controlled limiting of currents to a summing node that sums current from a bypass path with current from the low-frequency path. The conditionally-stable operational amplifier includes at least three integrator stages in a low-frequency path from a signal input to a signal output, and a relatively high-frequency bypass path for bypassing at least one of the integrator stages in the low-frequency path. The low-frequency path and the relatively high-frequency path converge at a current summing node combining current from a current source in the low-frequency path with current from a current source in the relatively high-frequency path. The current source in the relatively high-frequency path has a first saturation current limit, and the current source in the low-frequency path has a second saturation current limit. The first and second saturation current limits have values so that the relatively high-frequency path is not saturated when the low-frequency path saturates.

According to still another aspect of the invention, a conditionally-stable operational amplifier has a signal input, a signal output, a gain stage in a signal path from the signal input to the signal output, and a current feedback input. The gain stage is responsive to the current feedback input to assert an output signal on the signal output in response to current received at the current feedback input.

BRIEF DESCRIPTION OF THE DRAWINGS

Other objects and advantages of the invention will become apparent upon reading the following detailed description with reference to the accompanying drawings wherein.

DETAILED DESCRIPTION OF THE PREFERRED EMBODIMENT

Figure 1:
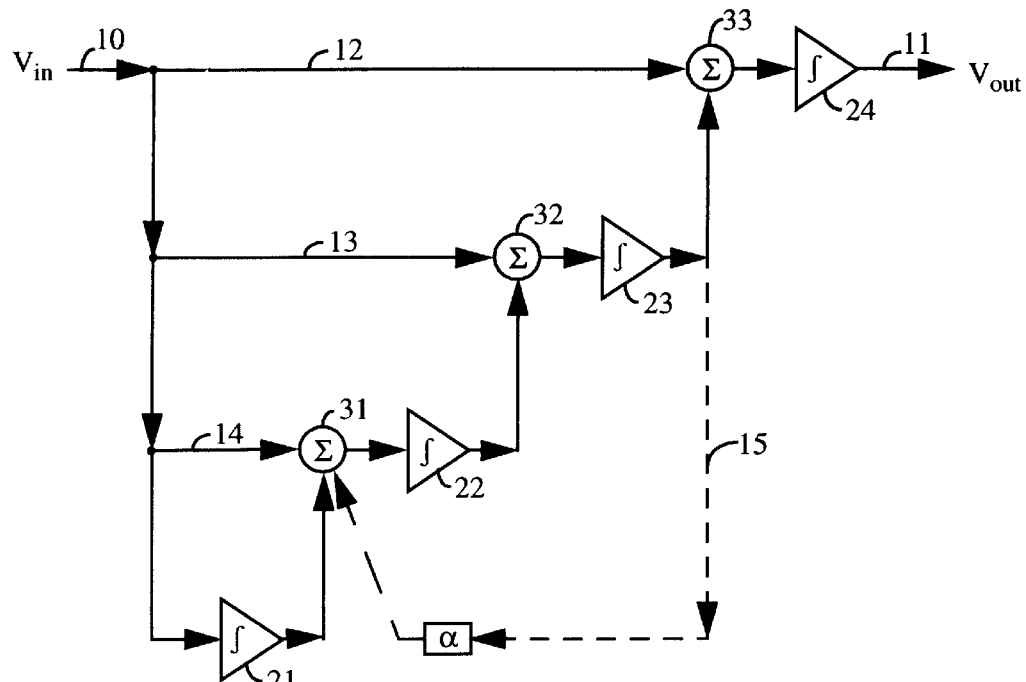
FIG. 1 is a schematic diagram of a high-order multipath operational amplifier having an optional feedback path around two integrators to provide a resonator.

Referring to FIG. 1, there is shown a schematic diagram of the signal path through a high-order multipath operational amplifier from a signal input 10 to a signal output 11. The operational amplifier has a low-frequency path including a series of integrator stages 21, 22, 23, and 24, and summers 31, 32, and 33. Each of the stages 21, 22, 23, and 24 functions as an integrator over some frequency range below the frequency at which the operational amplifier has unity gain. The operational amplifier has a high-frequency path including a high-frequency bypass path 12, the summer 33, and an output stage, which is the stage 24. The high-frequency path provides stability, and the low-frequency path provides large gain over a certain bandwidth. The operational amplifier also has intermediate bypass paths 13 and 14 which permit the operational amplifier to be conditionally stable when used in a feedback circuit having a certain range of values for the feedback factor $\beta$.

The key building block of a multipath operational amplifier is an integrator and an associated bypass path, such as the first stage integrator 21, bypass path 14, and summer 31. Such a building block has a transfer function given by $H = 1 + \omega_1/\omega j$. The term $\omega_1/\omega j$ is due to the integrator itself. The integrator provides a 90 degree phase lag and a power gain roll-off of −20 dB per decade. The frequency $\omega_1$ is the unity gain frequency for the first stage integrator 21. Substantially above the unity gain frequency $\omega_1$ the bypass path 14 dominates the sum from the summer 31, and the phase is reduced to substantially zero. The building block therefore provides a means for reducing the phase lag of the open-loop frequency response of the operational amplifier in a transition region just below the critical frequency for the maximum desired closed-loop gain $1/\beta$.

In general, a variety of circuit topologies are possible using the key building block. A particular circuit topology can be synthesized from the key building block. One starts with the output stage 24. The output stage 24 is a single integrator structure, and it sets the unity gain bandwidth. The output stage 24 can be a traditional operational amplifier design such as a single stage amplifier, a Miller compensated two stage amplifier, a current feedback amplifier, or a more complex structure.

By connecting the basic block in series with the output stage 24, one obtains a second order amplifier in which the integrator stage of the basic block is the input stage. To grow this second order amplifier into a third-order system, the path into and/or out of the integrator stage of the basic block is replaced with another basic block. For example, the fourth-order amplifier of FIG. 1 can be synthesized by replacing the direct path from the signal input 10 into the integrator stage of the basic block with another basic block, to obtain a third-order amplifier, and again replacing the direct path from the signal input into the first integrator in the low-frequency path by a basic block, resulting in the fourth-order amplifier of FIG. 1. This fourth-order amplifier has a transfer function given by:

$$H(s) = (\omega_4/s)\,(1+\omega_3/s(1+\omega_2/s(1+\omega_1/s)))$$

The synthesis procedure can be repeated a number of times to create a system of any desired order. In a general system, the integrator stages will be ordered according to the sequence of stages in the low-frequency path, and the integrator stages will also have respective positions in a hierarchy according to how far each integrator stage is removed from the high-frequency path by other integrator stages. The output stage is at the top of the hierarchy.

The choice of integrator gain-bandwidth is such that the added-on bypassed integrator should have substantially less bandwidth than the integrator it gets added to. In this manner a cascade of integrator stages is added with bypass paths to create the transition region where the phase rolls back from $(n)(90°)$, for an nth order amplifier, to about 90 degrees. In the fourth order amplifier of FIG. 1, this is achieved by choosing $\omega_3 > \omega_2 > \omega_1$, for example in the ratio of $\omega_3 = 2\omega_2 = 4\omega_1$. The ratio of the unity gain frequencies has to be large enough to avoid the effect that two or more integrators in series together produce phase reversal and thus may cancel a direct path. In practice, the unity gain bandwidth of the output stage is dictated by the implementation technology (e.g., bipolar silicon or CMOS), the power budget, and the loading conditions.

In the general case, the ratio of 2 between the unity gain frequencies is a good starting guess that should be verified by circuit simulation using a conventional digital computer program that plots the magnitude and phase of the transfer function of the circuit. As an alternative to a computer-aided iterative design process, an analytical approach could be used that would factor the open-loop or closed-loop frequency response, in terms of polynomials of s=jw, into poles and zeros, and choose desired pole locations, for example according to a Butterworth filter, of either the noise gain for the output stage or a desired frequency response. Solving for the unity gain bandwidths of the integrators gives the required design parameters. The conscious choice of pole location keeps all poles in the left hand plane, and thus guarantees stability.

Resonators (i.e., complex poles in the open-loop response) can be added by providing a feedback path around two integrators. For example, such a feedback path is shown in FIG. 1 as a dashed line. The position of the complex poles can be selected to some extent by a summation coefficient α determining an amount of the signal from the integrator 23 that is fed back to the input of the integrator 22. Resonators enhance the gain at relatively high frequency in return for reduced gain at lower frequency. This may be an advantageous trade-off to achieve a given gain at higher frequency. It is possible to use resonators to increase the open-loop gain-bandwidth product and obtain a steeper roll-off in the open-loop response.

One problem with a conditionally-stable operational amplifier is instability caused when the integrators become saturated by large signals or transients. When an integrator saturates, its open-loop frequency response H(s) is changed, so it is possible for the operational amplifier to become unstable. For an amplifier circuit synthesized from the key building block, saturation of the integrators should never cause an added-on bypassed integrator to have substantially less bandwidth than the integrator it gets added to. In view of the relationships between the unity gain frequencies of the integrators in FIG. 1, a slower integrator should never saturate a faster integrator, and a faster integrator should always saturate and overpower a slower integrator. This will ensure that the operational amplifier will have a stable transfer function under all operating conditions involving saturated integrators.

According to one aspect of the invention, stability of a conditionally-stable multi-path operational amplifier is ensured against large signals and transients by controlled limiting of currents to the summing nodes that sum currents from the bypass paths to the low-frequency path. The controlled limiting of currents ensures that when a large signal or transients causes saturation of an integrator stage that is bypassed by a bypass path, there will be a controlled limiting of current from the saturated integrator stage to the summing node following the saturated integrator stage and summing current from the bypass path around the integrator, and that controlled limiting of current from the saturated integrator stage to that summing node following the saturated integrator stage will occur before controlled limiting of current from the bypass path around that integrator to that summing node. Therefore, the higher frequency path is not saturated when the lower frequency path saturates.

In a preferred embodiment, at any one summing node, current from a bypass path has a higher limiting value than current from the low-frequency path, and currents from any bypass paths that bypass more integrator stages have higher limiting values than currents from bypass paths that bypass less integrator stages.

The limiting values of the current to a summing node is different from the weights or coefficients of a summing node. For example, in the circuit shown in FIG. 1, all of the summing coefficients may have unity values, except for the coefficient of a for the optional feedback path 15. Variation of the unity gain frequencies of the integrators, through choice of capacitor values and impedance or transconductance in the integrators, has the same effect as variation of summing coefficients. On the other hand, the limiting value of current from each of the bypass paths 12, 13, and 14 to their respective summing junctions has a value of one and the limiting value of current from each of the integrators 21, 22, 23 to their respective summing junctions has a value of one-half.

Figure 2:
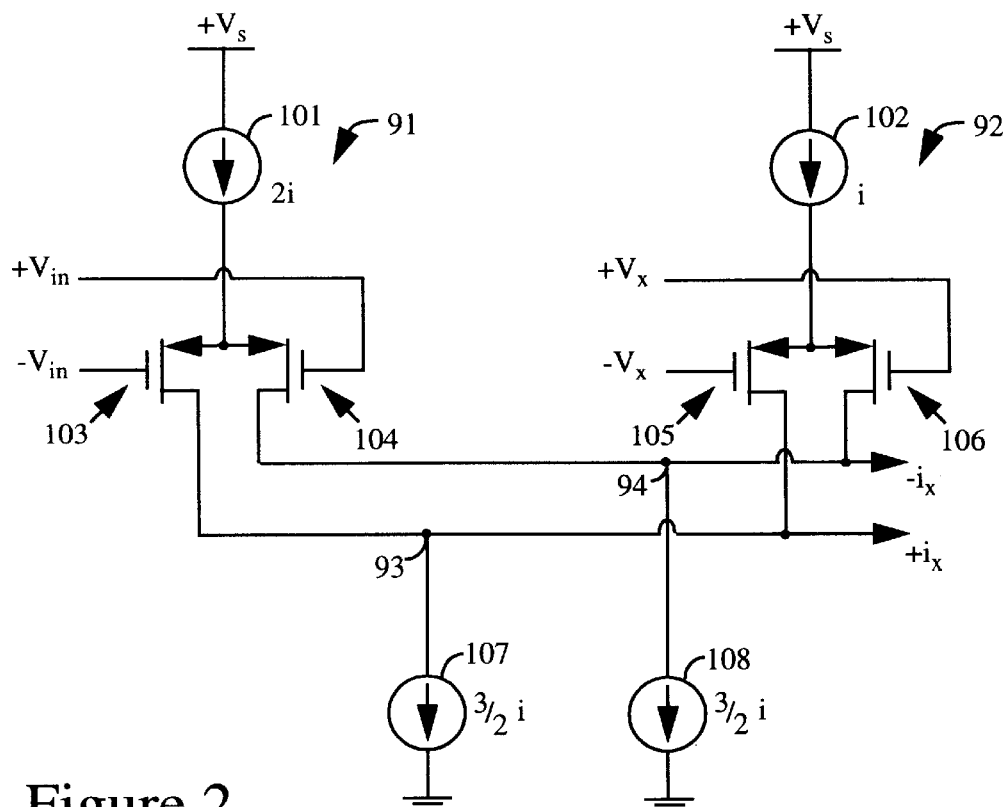
FIG. 2 is a schematic diagram of a summing junction employing differential amplifier transconductors and different saturation current limits for the inputs to the summer.

Referring to FIG. 2, there is shown a current limiting and summing circuit 90 for use in an integrated circuit. A differential amplifier 91, 92 is provided for each input path, and respective differential currents from the differential amplifiers 91, 92 are summed at respective summing nodes 93, 94. The first differential amplifier 91 includes a current source 101 and P-channel FET transistors 103, 104, and the second differential amplifier 92 includes a current source 102 and P-channel FET transistors 105, 106. Each summing junction connects the drain of a transistor in one differential pair to the drain of a transistor in another differential pair; in particular, the summing junction 93 connects the drain of the transistor 103 to the drain of the transistor 105, and the summing junction 94 connects the drain of the transistor 104 to the drain of the transistor 106. The limiting value of current from the relatively high frequency path including the first differential amplifier 91 is the value (2i) of current provided by the current source 101, and the limiting value of current from the relatively low frequency path including the second differential amplifier 92 is the value (i) of current provided by the current source 102. From the node 93, a current sink 107 draws a current having a value (3/2 i) which is one-half of the value of the sum of the current from the current source 101 and the current source 102. From the node 94, a current sink 108 sinks a current having a value of (3/2 i) which is also one-half of the value of the sum of the current from the current source 101 and the current source 102.

Figure 3:
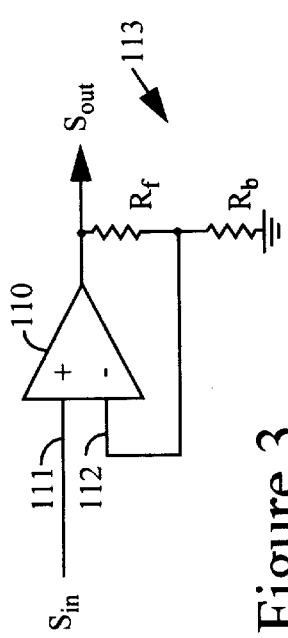
FIG. 3 is a schematic diagram showing the use of an operational amplifier in a non-inverting programmed gain circuit.

Referring to FIG. 3, a conditionally-stable operational amplifier 110 (such as the amplifier described further below with reference to FIGS. 5–13) has a positive signal input 111 receiving an input signal $S_{in}$, and a negative feedback input 112 receiving a feedback signal from a resistive voltage divider 113. The resistive voltage divider 111 is excited by the output signal $S_{out}$ of the operational amplifier, and has resistor values $R_f$ and $R_b$ that set the closed-loop gain of the operational amplifier 110. In this example, the feedback factor is $\beta=R_b/(R_f+R_b)$, and the programmed gain is $1/\beta=(R_f+R_b)/R_b$.

Figure 4:
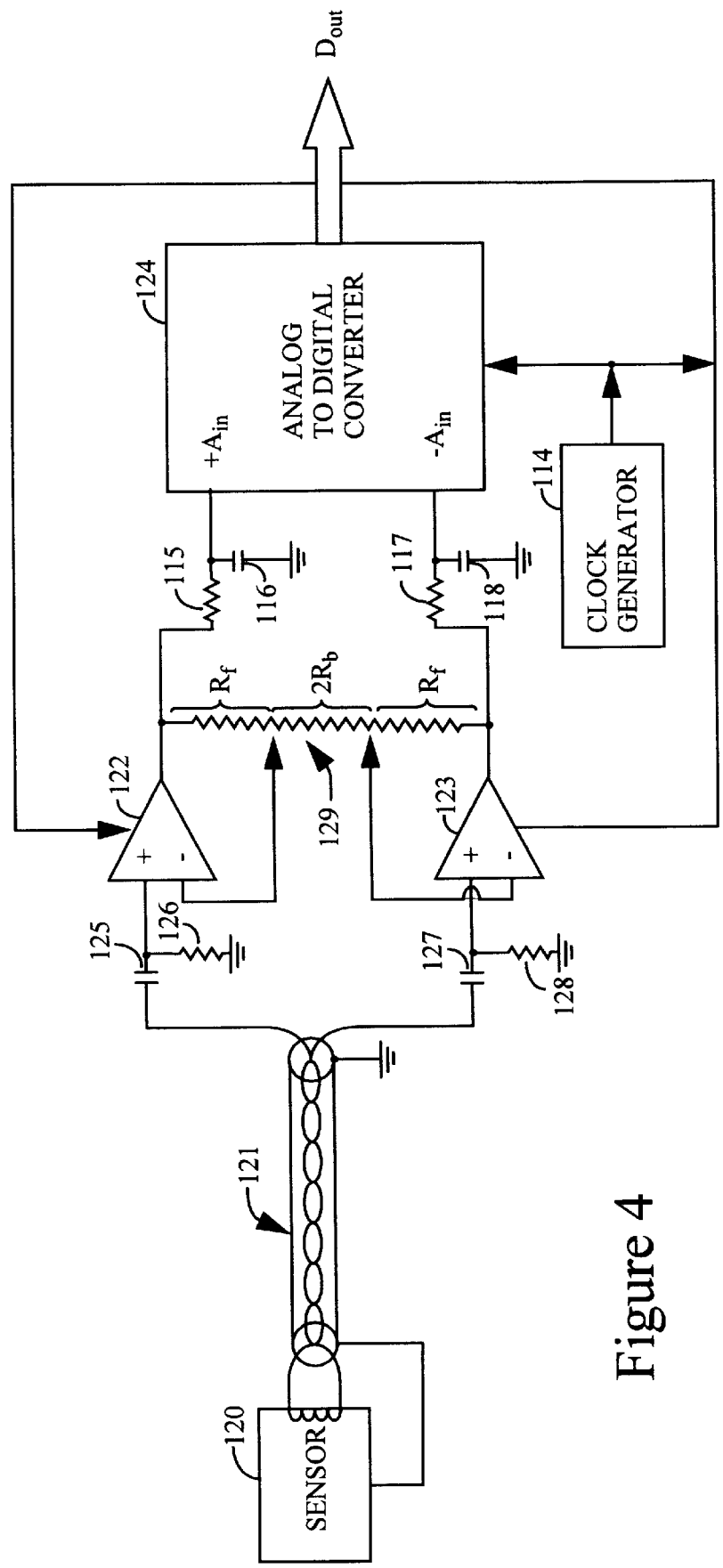
FIG. 4 is a schematic diagram showing a typical use of a chopper-stabilized high-order multipath operational amplifier in accordance with a specific embodiment of the invention for collecting data from a sensor.

Referring to FIG. 4, conditionally-stable operational amplifiers 122, 123 are used in a balanced non-inverting programmed gain amplifier circuit for amplifying a differential signal from a sensor 120. Each of the conditionally-stable operational amplifiers 112, 113, for example, is constructed as further described below with reference to FIGS. 5–13. The sensor 120 provides the differential signal over a twisted pair of conductors in a shielded cable 121. A respective one of the operational amplifiers 122, 123 amplifies the signal from each of the conductors in the twisted pair. The operational amplifiers 122, 123 provide differential signals to respective differential inputs $+A_{in}$, $-A_{in}$ of an analog-to-digital converter 124. The signal from the operational amplifier 122 to the input $+A_{in}$ passes through an anti-aliasing low-pass filter including a series resistor 115 (500 ohms) and a shunt capacitor 116 (50 nanofarads), and the signal from the operational amplifier 124 to the input $-A_{in}$ passes through an anti-aliasing low-pass filter including a series resistor 117 (500 ohms) and a shunt capacitor 118 (50 nanofarads). The analog-to-digital converter has a digital output $D_{out}$ providing a digital signal for numerical signal processing.

The sensor 120 is coupled to the operational amplifier inputs by capacitors 125 and 127. A DC bias for the operational amplifiers 122 and 123 is provided by shunt resistors 126, 128, respectively. A multi-tap resistor 129 shunts the outputs of the operational amplifiers 122, 123. At any given time, the taps on the resistor 129 are selected to provide the same feedback resistance $R_f$ to each of the operational amplifiers 122, 123. The resistance between the two taps connected at any one time to the negative feedback inputs of the operational amplifiers 122, 123, has a resistance of two times $R_b$, where $R_b$ corresponds to $R_b$ in the single-ended circuit of FIG. 3. The resistor 129, for example, has eight taps preselected so that the voltage gain $(R_f+R_b)/R_b$ can be programmed to a value of 2, 8, 16, or 32, and an N-channel FET switch (not shown) is associated with each tap for selectively connecting the tap to the negative feedback input of a respective one of the operational amplifiers 122, 123.

The circuit of FIG. 4 is particularly useful for the acquisition of seismic data. Seismic data is typically processed by numerical correlation having the ability to detect a signal buried in noise. In order to detect such a signal when the signal-to-noise ratio is very much less than one, it is necessary for the circuits in FIG. 4 to be highly linear. This linearity is typically quantified in terms of the ratio of the total harmonic distortion power to the signal power. For example, a delta-sigma analog-to-digital converter, such as part number CS5321 from Crystal Semiconductor Corporation, 4209 S. Industrial Drive, Austin, Tex., provides less than −115 dB total harmonic distortion. Therefore, it is desired for the operational amplifier circuits to also provide less than −115 dB of total harmonic distortion. This in turn requires the operational amplifiers 122, 123 to have very high open-loop gain from zero hertz to about 800 hertz and to have a very high gain-bandwidth product. For low power operation using conventional silicon integrated circuit technology, these constraints dictate that the operational amplifier is only conditionally stable. For example, for a closed-loop gain of 30 dB, and a distortion specification requiring 120 dB gain at a bandwidth of 800 Hz, the required gain-bandwidth product is (800 Hz) * (10 ** (0.5 * (30 dB+120 dB)))=24 GHz. Such a large gain-bandwidth product is impossible to obtain from an unconditionally stable operational amplifier in conventional silicon integrated circuit technology.

Figure 5:
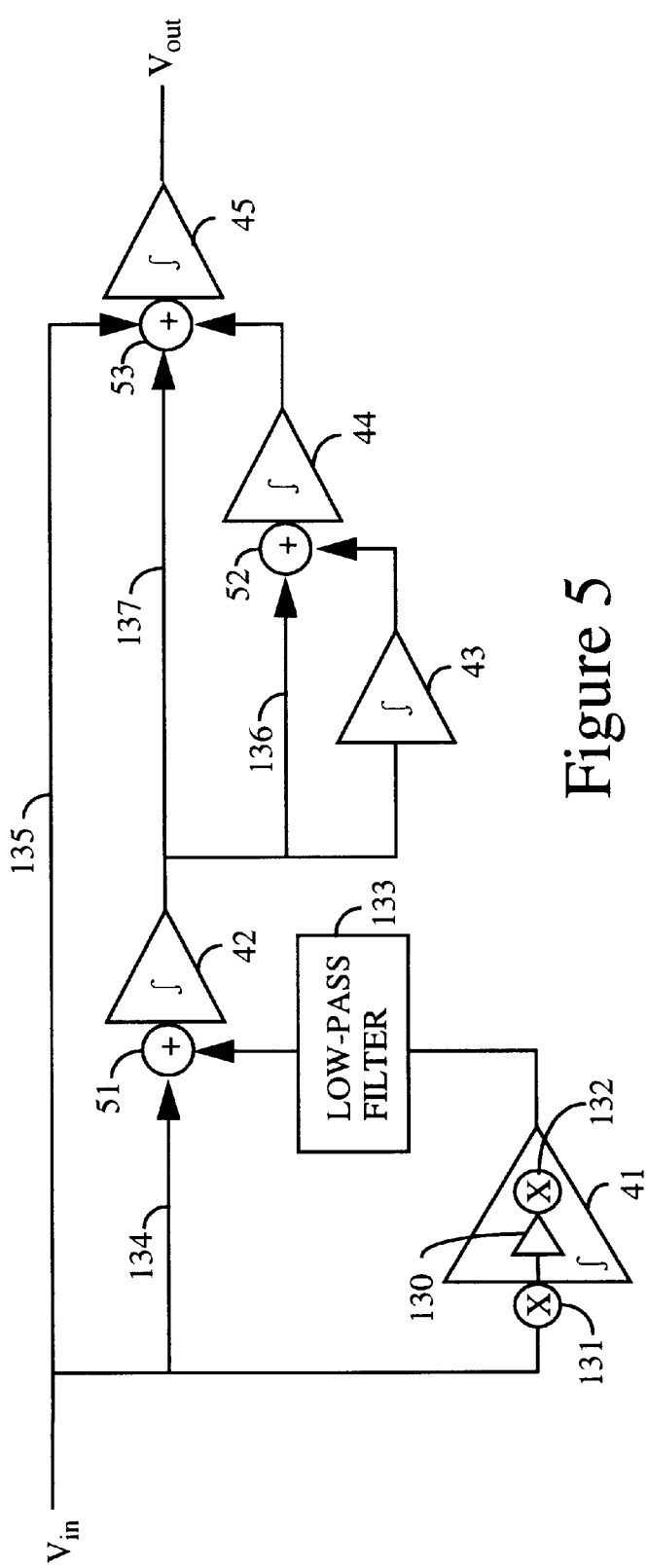
FIG. 5 is a block diagram of the chopper-stabilized high-order multipath operational amplifier used in FIG. 4.

Referring to FIG. 5, there is shown a block diagram of a fifth-order multipath conditionally-stable operational amplifier suitable for use in the circuit of FIG. 4. This operational amplifier should have an open-loop power gain at zero hertz of at least 200 dB, an open-loop power gain at 800 hertz of at least 150 dB, a gain-bandwidth product of 3,000 GHz, a power consumption of about 4.5 mW using a 5 volt power supply ($+V_s$ in FIGS. 10–13), a noise density of 3.5 nV/sqrt (Hz), and a noise voltage of about 70 nV over a bandwidth of 3 to 400 Hz. For an 800 Hz signal at a nominal voltage gain setting of eight, the total harmonic distortion should be less than minus 116 dB.

As seen in FIG. 5, the operational amplifier has five integrator stages 41, 42, 43, 44, 45, and three summers 51, 52, 53. There is a low-frequency path including all five of the integrators 41–45 that is optimized for high gain, low noise, and low distortion. There are a number of relatively high-frequency paths 134, 135, 136, 137 providing stability. Most of the power is consumed in the input stage 41 in order to reduce noise. Power consumption is reduced to some degree by using a relatively slow and relatively nonlinear output stage 45.

In order to obtain low noise in the input stage 41, the transistors in a differential amplifier 130 of the input stage are physically large and have a very large transconductance. Although this large transconductance considerably reduces the effects of thermal noise, the 1/f noise is still significant. Moreover, the differential amplifier 130 has a relatively large voltage offset. In order to reduce the 1/f noise and the voltage offset, the differential input stage is chopper stabilized. For example, the input signal $V_{in}'$ is chopped by a chopper 131 driven at a frequency of 512 kilohertz, which is also a sampling frequency of the analog-to-digital converter 124 in FIG. 4. The first stage integrator 41 has an internal chopper 132 driven in synchronism with the chopper 131. For example, as shown in FIG. 4, each of the operational amplifiers 122 and 123, and also the analog-to-digital converter 124, receives a clock signal from the clock generator. From this clock signal, the operational amplifiers 122, 123 each produce internal signals which control the chopping, and from the clock signal, the analog-to-digital converter 124 produces signals that govern sampling and conversion of the analog input signals $+A_{in}$, $-A_{in}$. Further details regarding sampling in an analog-to-digital converter, for example, are found in Early et al, U.S. Pat. No. 4,939,516, incorporated herein by reference.

Referring to FIG. 5, charge injection by the input chopper 131 creates small input currents on the order of a few nanoamperes. Moreover, there is some imbalance in the input chopper 131 and the output chopper 132, which creates an up-modulated offset waveform which is a square wave at the chopped frequency. A three-pole analog low-pass filter 133 having a bandwidth of 60 kHz attenuates these chopping artifacts. The low-pass filter 133 also has an attenuation factor of 1/64 at zero frequency, in order for the operational amplifier to have a desired degree of conditional stability. This rather high attenuation factor balances the high transconductance of the input transistors in the first stage differential amplifier. This rather high attenuation factor in turn sets a limit on the maximum amount of voltage offset that can be tolerated in the second stage integrator 42 without an objectionable shift in the quiescent voltage levels in the second stage integrator 42.

The first stage 41 has a unity gain bandwidth of about 2.56 MHz. Considering the attenuation factor of 1/64 of the low-pass filter 133 and a relative summing weight of one half in the summer 51, the first stage 41 provides a 20 kHz unity gain factor ($\omega_1/s$) relative to the intermediate path 134 directly bypassing the first stage. The second stage 42 has a bandwidth of about 200 kHz, and considering a relative summing weight of one half in the summer 53, the second stage provides a 100 kHz unity gain factor ($\omega_2/s$) relative to the direct path 135 bypassing the second stage. The third stage 43 has a bandwidth of about 40 kHz, and considering a relative summing weight of one half in the summer 52, the third stage provides a 20 kHz unity gain factor ($\omega_3/s$) relative to the intermediate bypass path 135. The fourth stage 44 has a unity gain bandwidth of about 240 kHz, and considering a relative summing weight of one quarter in the summer 53, the fourth stage provides a 60 kHz unity gain factor ($\omega_4/s$) relative to the intermediate bypass path 137. The output stage 45 has a unity gain bandwidth $\omega_5$ of about 5 MHz. Over the frequency range for which the integrator stages function as nearly ideal integrators, the open-loop response H(s) of the operational amplifier circuit in FIG. 5 is:

$$H(s)=(\omega_5/s)\,(1+\omega_2/s(1+\omega_1/s)\,(1+\omega_4/s(1+\omega_3/s)))$$

Figure 6:
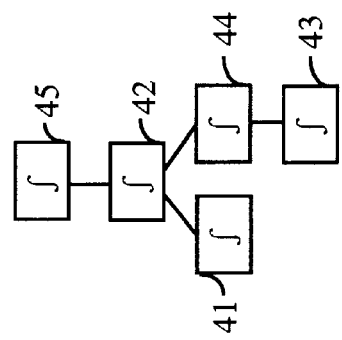
FIG. 6 is a diagram showing the hierarchy of the integrators in the operational amplifier circuit of FIG. 5.

The integrators 41 to 45 in the operational amplifier of FIG. 5 occupy respective positions in a hierarchy as shown in FIG. 6. The output stage 45 is at the top of the hierarchy because it occupies a place in a direct path from the input $V_{in}'$ to the output $V_{out}'$. The second integrator 42 is at a second level in the hierarchy because the most direct path including it from the input $V_{in}'$ to the output $V_{out}'$ includes two integrator stages. The first stage 41 and the fourth stage 44 are each at a third level in the hierarchy, because the most direct path including each of them from the input $V_{in}'$ to the output $V_{out}'$ includes three integrators. The third stage integrator 43 occupies a fourth level in the hierarchy and depends from the fourth stage integrator 44 because there are four integrators including integrators 44, 42, and 45 in the most direct path including integrator 43 from the input $V_{in}'$ to the output $V_{out}'$.

Figure 7:
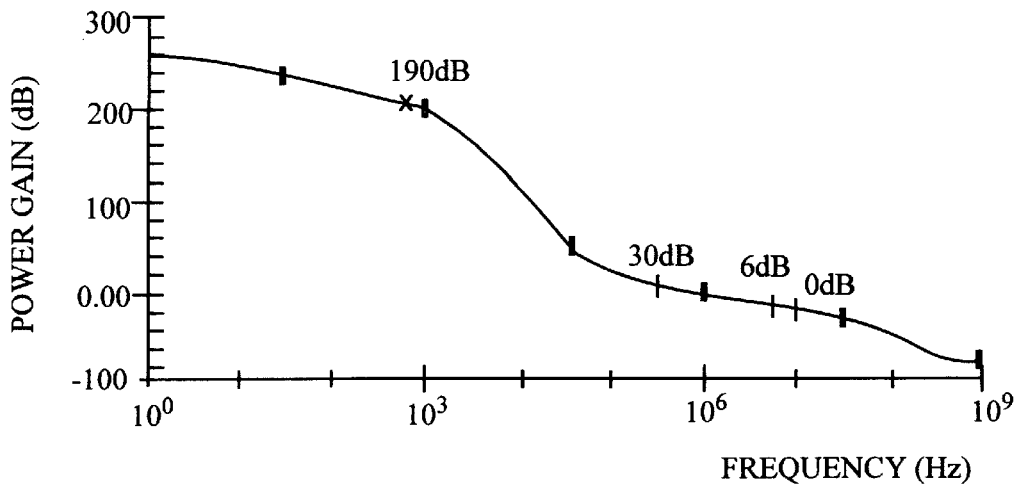
FIG. 7 is a graph of the power gain in decibels versus frequency in hertz for the open-loop response of the operational amplifier circuit in FIG. 5.
Figure 8:
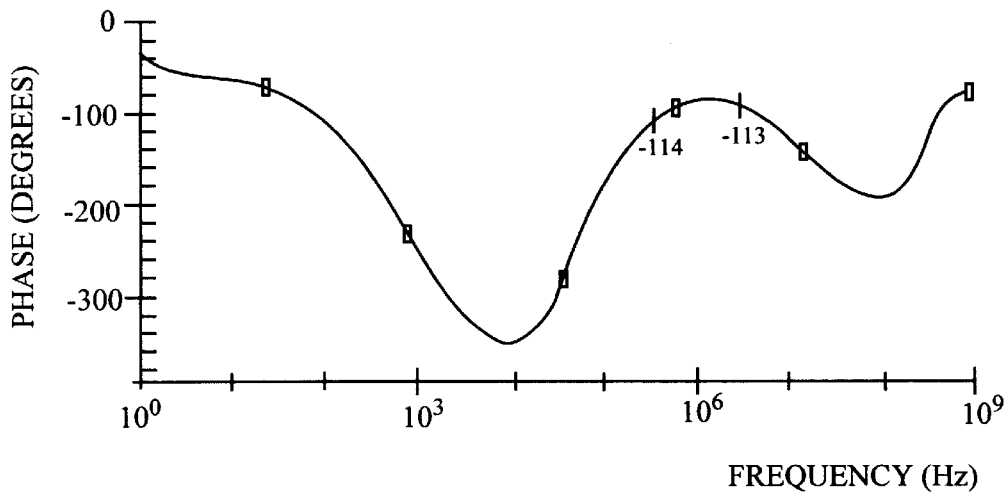
FIG. 8 is a graph of the phase in degrees versus frequency in hertz of the open-loop response of the operational amplifier circuit in FIG. 5.
Figure 9:
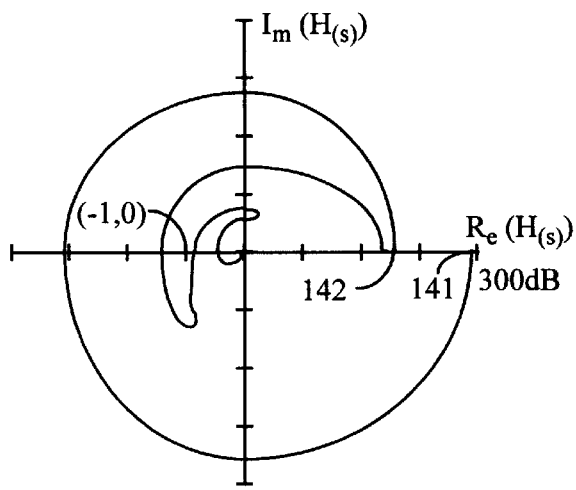
FIG. 9 is a Nyquist plot of the open-loop response of the amplifier circuit in FIG. 5.

The unity gain frequencies of the integrator stages in the operational amplifier of FIG. 5 have been selected to provide an open-loop response having the power gain shown in FIG. 7, a phase response as shown in FIG. 8, and the Nyquist plot shown in FIG. 9. As seen in the power gain plot of FIG. 7, the power gain is about 190 dB at 800 Hz, 30 dB at 500 kHz, and 6 dB at 5 MHz. As seen in FIG. 8, the phase drops rapidly from about −100 degrees at 300 Hz to −360 degrees at about 8 kHz, but then the phase increases back to about −90 to −120 degrees over a frequency range of 500 kHz to 5 MHz.

The phase of minus 180 degrees from about 600 Hz to about 80 kHz indicates that the amplifier is not unconditionally stable. As more clearly seen from the Nyquist plot of FIG. 9, the operational amplifier is conditionally stable and could be used for very stable closed-loop gains from about zero to about 35 dB.

In the case where the negative feedback is obtained from a voltage divider having a divider ratio of β, the closed-loop frequency response is given by the ratio H(s)/(1+βH(s)). In mathematical terms, the parameter "s" in H(s) is a complex number related to the frequency ω by s=jw where j is the square root of −1, and the feedback circuit is unstable if the denominator 1+βH(s) has a pole on the imaginary axis or anywhere to the right of the imaginary axis in the complex "s" plane. According to the Nyquist criterion, the feedback circuit is at least conditionally stable if the magnitude and phase of the open-loop frequency response, when plotted on the complex "s" plane, does not encircle the point (−1/β, 0). In practice, this does not constrict the phase shift at frequencies substantially greater than the critical frequency at which the open-loop gain is 1/β, so long as the phase shift is "rolled back" around the point (−1/β, 0) to less than 180 degrees at the critical frequency if the phase shift ever exceeds 180 degrees for any frequency less than the critical frequency.

In the Nyquist plot of FIG. 9, the phase begins at zero degrees and zero hertz at the point 141. With increasing frequency, the phase decreases in a clockwise direction until the point 142 where a phase shift of zero degrees is again obtained. This point 142 is a midpoint in the transition from low frequency behavior to high frequency behavior. As the frequency further increases, the gain continues to decrease but at a slower rate and the phase loops back around the critical point (−1, 0) to satisfy the Nyquist criterion for operation with a closed-loop unity gain and gains up to more than 30 dB. The Nyquist plot terminates at the origin for infinite frequency.

Figure 10:
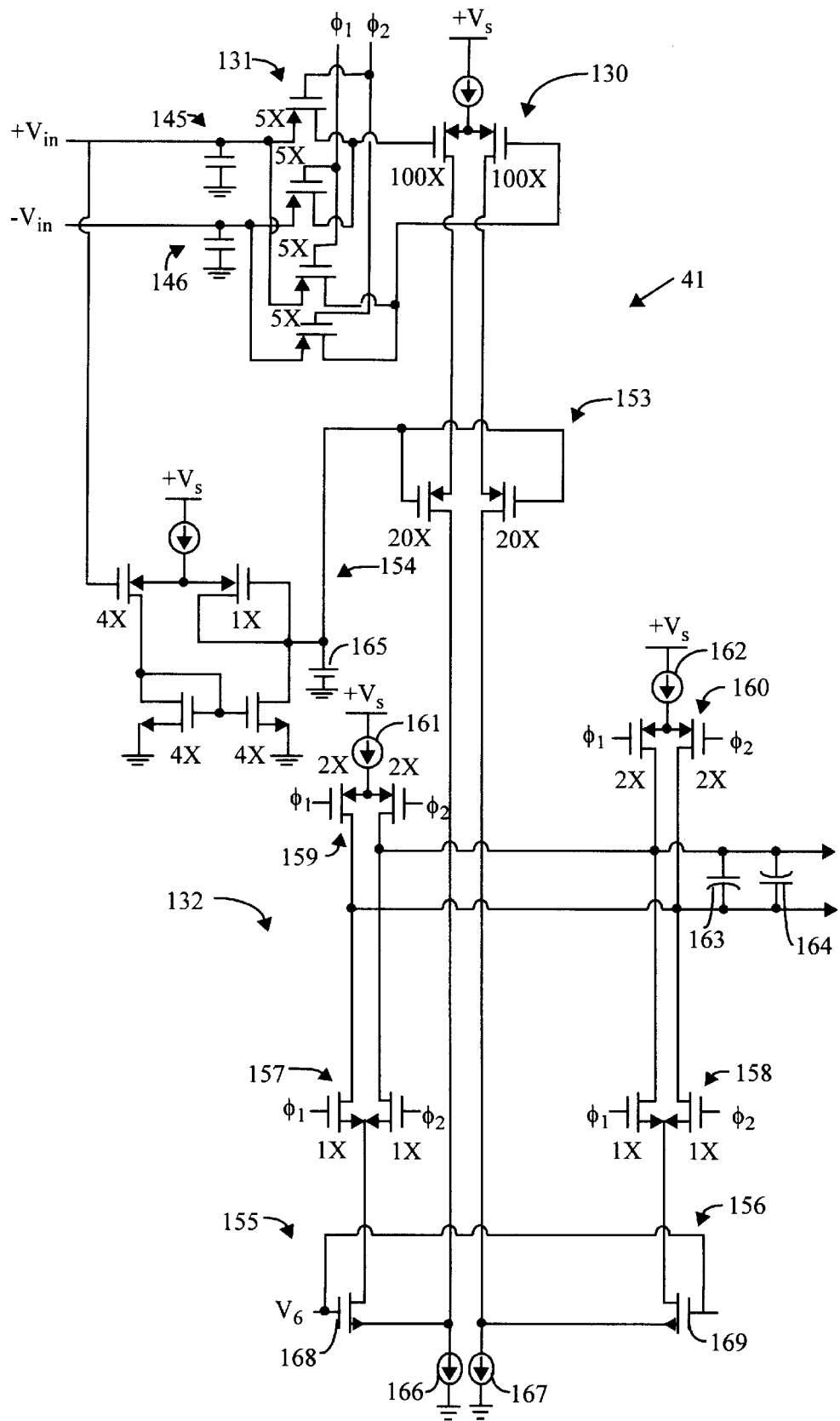
FIG. 10 is a schematic diagram of the first integrator and choppers in the operational amplifier circuit of FIG. 5.

Referring to FIG. 10, there is shown a schematic diagram of the first integrator stage 45' in the operational amplifier of FIG. 5. The input signals $+V_{in}$ and $-V_{in}$ are applied to grounded capacitors 145, 146 (50 picofarads each) which suppress charge injection pulses from the P-channel FET switches of the input chopper 131. Each of the P-channel FET switches is labeled with a designation 5X indicating that each has a channel width (normal to the direction from the source to the gate) that is fives times longer than the typical, minimum channel width for P-channel transistors in the integrated CMOS technology used for fabricating the circuit. The channel lengths of the different sized transistors are the same, so that the designation 5X also indicates a transconductance that is the square root of five times that of a 1X size transistor, and a saturation current that is five times that of a 1X size transistor. Similar size indications are provided for the other transistors in FIG. 13 and in following figures.

The chopped input signals are applied to the gates of respective 100X size P-channel FETs in the differential amplifier circuit 130. Currents from the differential amplifier 130 pass through a pair of P-channel transistors 153 connected in a cascode arrangement with respect to the differential amplifier 130. Gate voltage for the cascode transistors 153 is provided by a differential amplifier 154 connected to function as a unity gain voltage follower and receiving the positive input voltage $+V_{in}$. The output voltage of the unity gain follower 154 is stabilized by a grounded capacitor 165 (1.5 picofarads).

The currents from the differential amplifier 130 are conveyed through folded cascode nodes 155, 156 into the output chopper 132. The folded cascode nodes include respective current sinks 166, 167 and N-channel cascode transistors 168, 169 having their gates set at a bias voltage $V_b$. The output chopper 132 includes N-channel FET switches 157 and 158 for demodulating the chopped signal and also P-channel FET switches 159 and 160 for chopping current from active load current sources 161 and 162. The differential output current from the chopper 132 is integrated in parallel-connected shunt capacitors 163 and 164 (55 picofarads each) which provide output voltages $+v_1$ and $-v_1$. The upper plate of each of the shunt capacitors 163, 164 is connected to the lower plate of the other one of the shunt capacitors, in order to equalize the parasitic capacitance to ground for each of the differential outputs, and to cancel odd ordered non-linearities contributing to the voltage coefficient of the capacitors. This kind of connection of pairs of shunt capacitors is used uniformly for other pairs of shunt capacitors shown in the drawing figures.

Figure 11:
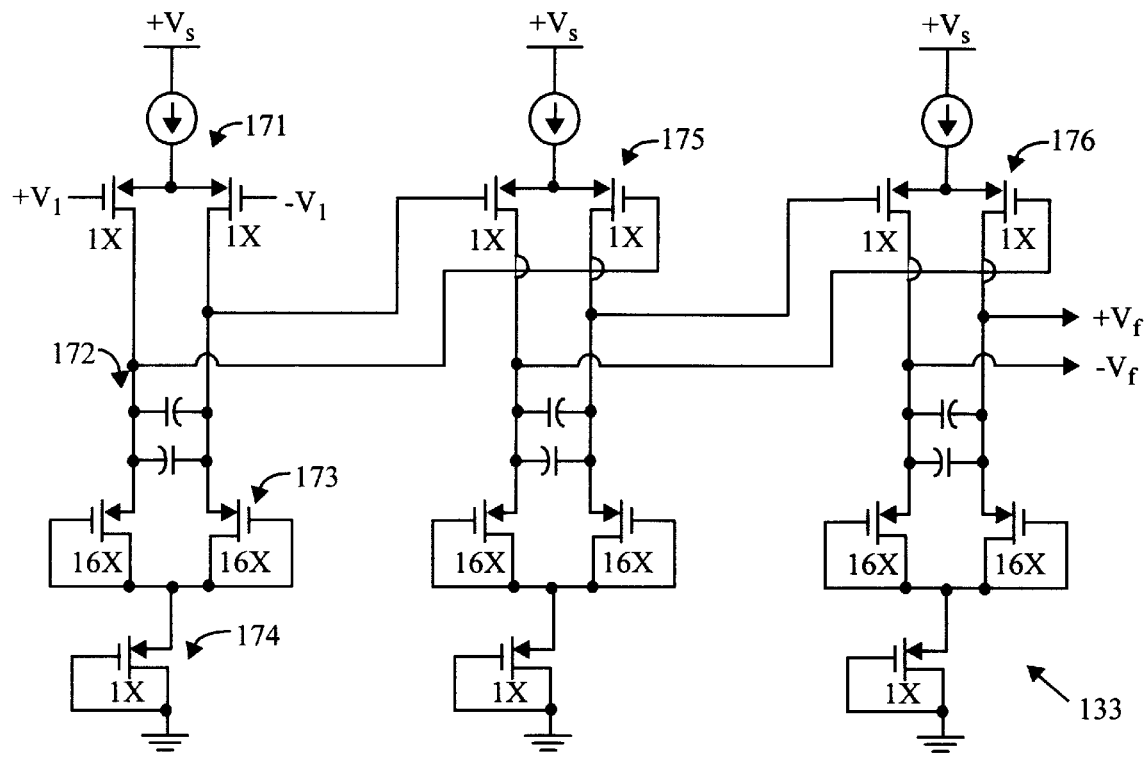
FIG. 11 is a schematic diagram of the analog low-pass filter in the operational amplifier circuit of FIG. 5.

Referring to FIG. 11, there is shown a schematic diagram for the three-pole analog low-pass filter 133. The low-pass filter 133 also provides an attenuation factor of 1/64. The voltages $+v_1, -v_1$ are applied to the gates of a first differential amplifier 171 having P-channel transistors of size 1X. The first differential amplifier 171 sources currents to P-channel load transistors 173 of size 16X and a common load transistor 174 of size 1X in order to provide an attenuation factor of ¼ for the differential signal. A pair of capacitors 172 (8 picofarads each) shunt the output of the first differential amplifier 171 and set a first pole for the low-pass filter 133.

The output of the first differential amplifier 171 is applied to the input gates of a second P-channel differential amplifier 175, which is substantially identical to the first differential amplifier and provides a second attenuation factor of ¼. The output of the second differential amplifier 175 is applied to a third and final differential amplifier 176 which is also substantially identical to the first differential amplifier 171. The third and final differential amplifier 175 provides a third attenuation factor of ¼ and has a differential output $+v_f, -v_f$ that is the output of the low-pass filter 133.

Figure 12:
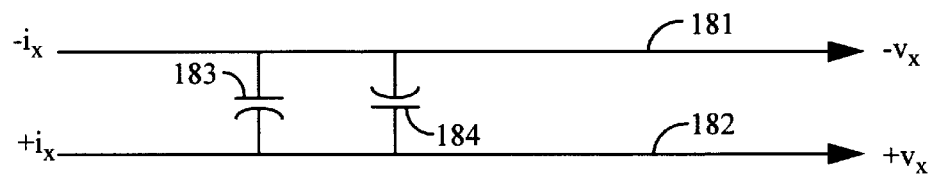
FIG. 12 is a schematic diagram of a capacitor circuit used in the second, third, and fourth integrators in the operational amplifier circuit of FIG. 5.

The second integrator 42, the third integrator 43, and the fourth integrator 44 of the operational amplifier of FIG. 5 each consist of a summer circuit as shown in FIG. 2 and output capacitors as shown in FIG. 12. The single input for the third stage integrator 43 is formed by connecting together the positive inputs and connecting together the negative inputs of the summer of FIG. 2. This is done as a matter of convenience so that the same integrated circuit layout can be used for all three of the intermediate integrator stages 42, 43, and 44.

As shown in FIG. 12, the differential output lines 181, 182 are shunted by a pair of capacitors 183 and 184. (For integrator stages 42 and 43 they have 10 picofarads each; for integrator stage 44 they have 5 picofarads each.)

Figure 13:
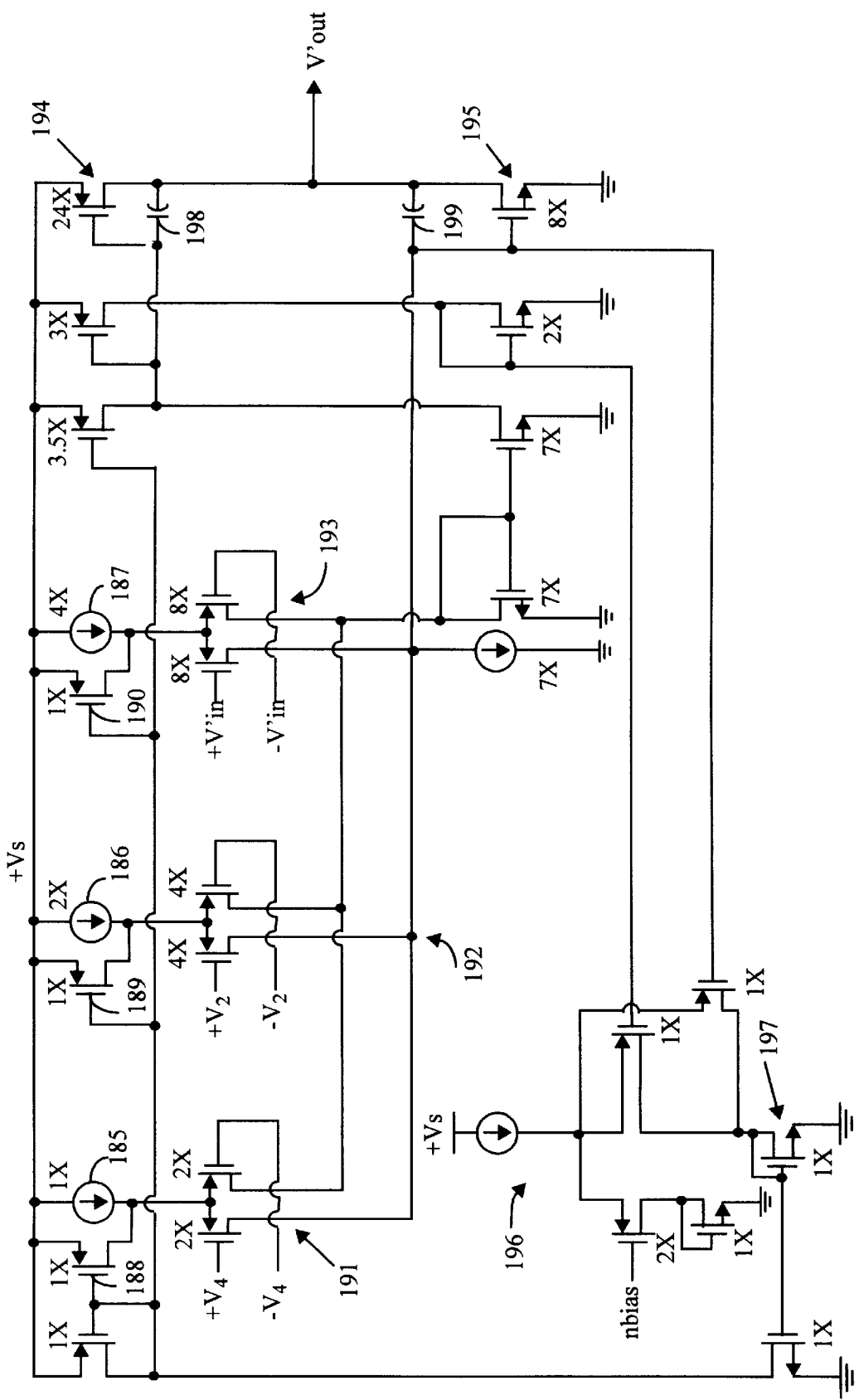
FIG. 13 is a schematic diagram of the output stage summer and integrator in the operational amplifier circuit of FIG. 5.

Referring to FIG. 13, there is shown a schematic diagram of the output stage integrator 45. This output stage is a power efficient class AB output stage with moderate 5 MHz gain-bandwidth requirements. Relatively large nonlinearity can be tolerated. The output stage is designed to a nominal two kilohm feedback resistor, a 500 ohm and 50 nanofarad anti-alias low-pass filter for a delta-sigma analog-to-digital converter, and 20 picofarads of parasitic output capacitance, for example in the system of FIG. 4. The high-frequency path in the output stage is stable for the switched voltage gain range from 2 to 32. The relatively low bandwidth requirement for the output stage significantly simplifies the design. Parasitic poles occur at much higher frequencies. The output stage provides a low quiescent power consumption of less than 1 milliwatt.

The three summing inputs are provided by respective P-channel differential amplifiers generally designated 191, 192, and 193. The input differential amplifiers 191, 192, 193 have weighted static current sources 185, 186, 187 with respective quiescent and saturation current ratios of 1, 2, and 4, and they also have controlled common mode P-channel current source transistors 188, 189, 190 for class AB control of the output transistors 194, 195. In particular, there is a common mode bias generator including a differential amplifier 196 that creates a common mode bias current by summing the bias to the P-channel output transistor 194 with the bias to the N-channel output transistor 195 and comparing the sum to a bias voltage (nbias) setting the level of current for the all of the current sinks in the single-chip integrated circuit implementation of the operational amplifier circuit of FIG. 5. The output of the differential amplifier 196 is reflected in a current mirror 197 that controls the P-channel current source transistors. The output stage is compensated by respective Miller effect capacitors 198 and 199 (2 picofarads each) augmenting the gate to drain capacitance of the output transistors 194 and 195.

Figure 14:
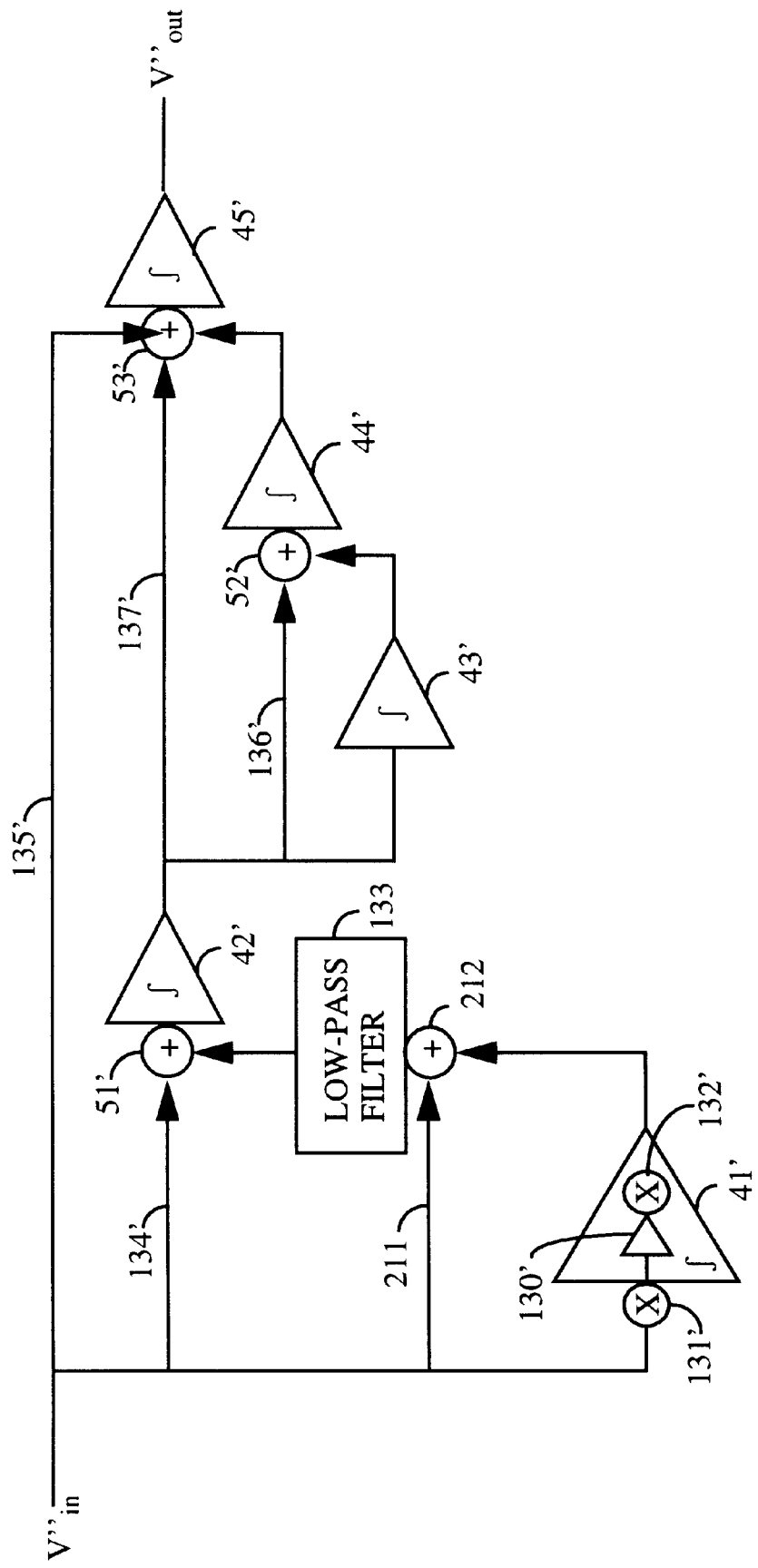
FIG. 14 is a block diagram of an alternative version of a chopper-stabilized high-order multipath operational amplifier which is similar to the circuit in FIG. 5, but which further includes an intermediate bypass path from a signal input to an input of an analog low-pass filter that attenuates chopping artifacts.

Referring now to FIG. 14, there is shown a block diagram of an alternative version of a chopper-stabilized high-order multipath operational amplifier which is similar to the circuit in FIG. 5. Components in FIG. 14 which are similar to components in FIG. 5 are designated with similar but primed reference numerals. The amplifier of FIG. 14 includes an additional bypass path 211 around the first integrator stage 41' to a summer 212 in the low-frequency path before the low pass filter 133'. The additional bypass path 211 ensures that the combination of the first integrator 41' and the low-pass filter 133' will not cause a phase reversal tending to cancel the signal in the bypass path 134'. Therefore, the additional bypass path around the first stage integrator 41' permits a decrease in the cut-off frequency of the low-pass filter 133' for increased attenuation of chopping artifacts.

The operational amplifier of FIG. 5 is designed to be stable in a feedback loop having a closed-loop voltage gain from about 2 to 32. So that the stability of the amplifier is not appreciably affected by the change in gain, the phase in the open-loop response is substantially constant over the desired range of gain. As a consequence, the power gain drops off at a relatively low rate of about 20 dB per decade over the corresponding frequency range.

It would be desirable to provide a conditionally-stable operational amplifier that can be used in the non-inverting feedback circuit of FIGS. 3 and 4 for a wide range of adjustable gain, and so that the gain bandwidth product need not be fixed for a particular maximum value of open-loop gain. One solution to this problem is to provide a means for adjusting the compensation capacitance in the operational amplifier so that it can be adjusted along with the gain set by the feedback circuit. The compensation capacitors could be switched, for example, by FET switches that would switch in or switch out discrete capacitance values. However, this would require additional inputs to the operational amplifier and associated external digital controls for setting the desired value of compensation capacitance.

Figure 15:
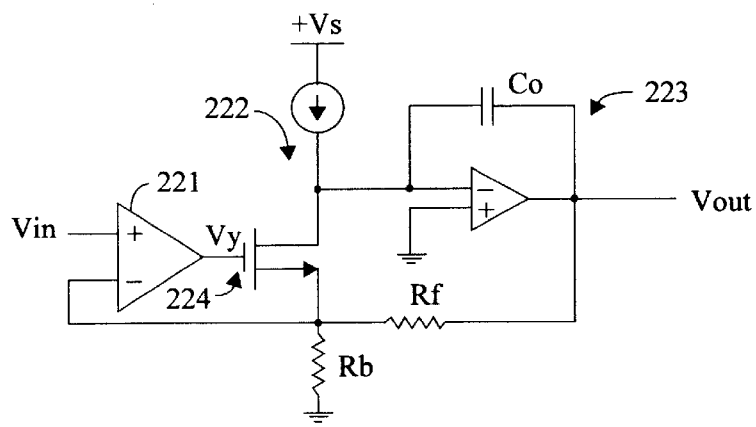
FIG. 15 is a schematic diagram showing the use of current feedback in an operational amplifier circuit in order to provide an adjustable gain and a bandwidth substantially independent of the gain adjustment.

A more elegant solution to the problem of maintaining a desired level of stability over a wide range of closed-loop gain is illustrated by the operational amplifier circuit in FIG. 15. In this case, the operational amplifier includes a differential input stage 221, a source follower stage generally designated 222, and an output stage integrator 223. The source of an N-channel MOSFET transistor 224 is connected to the negative input of the input stage differential amplifier 221. The load resistance for the source follower stage 222 is the shunt resistance $R_b$ of the feedback circuit which further includes the feedback resistor $R_f$ connecting the source of the transistor 224 to the output $V_{out}$ of the integrator 223.

Assuming for the moment that $R_f$ is substantially greater than the shunt resistance $R_b$, then the transconductance of the source follower stage 222 is substantially equal to the shunt resistance $R_b$. Consequently, the voltage gain $V_{out}/V_y$ of the source follower in combination with the output stage integrator is equal to $1/jwCR_b$. Therefore, the open-loop gain of the operational amplifier in FIG. 15 is inversely proportional to the shunt resistance $R_b$. Since the closed-loop gain of the operational amplifier circuit is also inversely proportional to the shunt resistance $R_b$, the stability of the operational amplifier circuit is not substantially affected by the change in gain caused by a change in the shunt resistance $R_b$. Moreover, when the gain is adjusted by adjustment of the shunt resistance $R_b$, the closed-loop bandwidth remains substantially constant.

Figure 16:
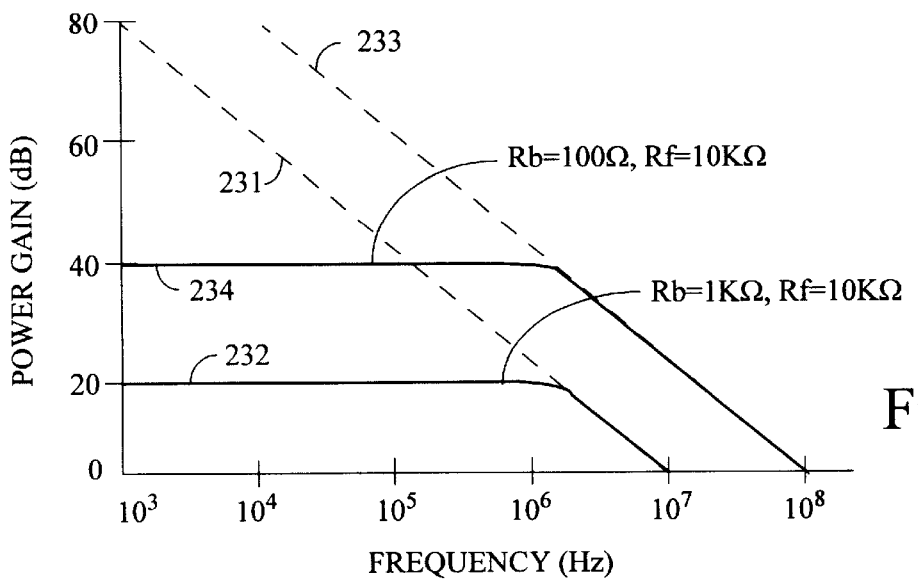
FIG. 16 is a plot of the power gain versus frequency for the output stage of the current feedback operational amplifier circuit of FIG. 15.

As shown in FIG. 16, when the shunt resistance $R_b$ is 1 kilohm, for example, the power gain as a function of frequency for the combination of the source follower 222 and the output stage integrator 223 is the linear response 231 shown as a dashed line extending from 80 dB at a frequency of 1 kHz to zero dB at a frequency of 10 MHz. The close loop frequency response for a shunt resistance $R_b$ of 1 kilohm and a feedback resistance of $R_f$ of 10 kilohms is shown as the solid line 232. When the shunt resistance $R_b$ is decreased to 100 ohms and the feedback resistance $R_f$ is maintained constant at 10 kilohms, the open-loop response 232 is translated upward by about 20 dB and the close loop response is also translated upward by about 20 dB to the solid line designated 234. In either case, the signal in the differential amplifier input stage 221 is substantially unaffected by the change in the shunt resistance $R_b$ when the feedback resistance $R_f$ is kept constant. Therefore, if the input stage differential amplifier 221 is conditionally stable, the stability of the operational amplifier circuit in FIG. 15 is unaffected by the change in the shunt resistance $R_b$ and the change in gain responsive to the change in the shunt resistance. Moreover, the closed-loop bandwidth of the operational amplifier circuit from the input $V_{in}$ and to the output $V_{out}$ remains constant as the shunt resistance $R_b$ is adjusted.

In general, the circuit of FIG. 15 is employing current feedback so that the closed-loop bandwidth stays constant as the gain of the circuit is adjusted in response to the resistance presented to the negative feedback input. The negative feedback input is connected directly to the source of the transistor 224, and the source of the transistor 224 is a relatively low-impedance current feedback input. The transistor 224 could be a bipolar transistor instead of a field-effect transistor, in which case the emitter of the bipolar transistor would provide the current feedback input. In either case the transistor functions as a controlled voltage source or voltage follower to apply a controlled voltage signal to the current feedback input, and the transistor also functions to receive a current signal from the current feedback input and to convey the current signal to the output stage. The current signal that the output stage integrates is inversely proportional to the input resistance $R_{in}=R_b R_f/(R_b+R_f)$ presented to the current feedback input.

The closed-loop bandwidth is a function of the feedback resistance $R_f$, but it is substantially independent of the input resistance $R_{in}$. A high-order conditionally-stable current feedback operational amplifier can have a limited range of feedback resistance $R_f$ for stability, but a wide range of input resistances $R_{in}$ and thus create a wide range of practical gain settings. The main (high frequency) integrator 223 will have $1/(R_{in}C_0)$ as a time constant. Other integrators in the operational amplifier can have time constants set by $g_m/C$ terms. These other time constants will not vary significantly with the input resistance $R_{in}$. The variation of $R_{in}$ tracks the closed-loop gain variations. It is important, however, that the output impedance presented by the operational amplifier be lower than the input resistance $R_{in}$. Otherwise, the open-loop gain will not be inversely proportional to the input resistance $R_{in}$ and the closed-loop bandwidth will not be substantially constant as the close loop gain is adjusted by variation in the input resistance $R_{in}$.

Although a single source follower or emitter follower is shown in FIG. 15 for providing a current feedback input, more complex circuits can be used to provide current feedback inputs. For example, a number of alternative current feedback input circuits are disclosed in Saller et al. U.S. Pat. No. 4,780,689 issued Oct. 25, 1988 and incorporated herein by reference.

Figure 17:
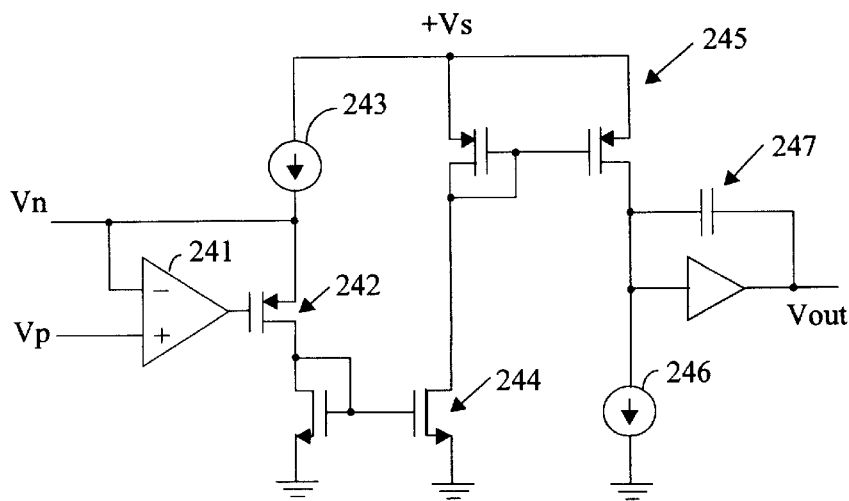
FIG. 17 is an alternative construction for a current feedback operational amplifier suitable for circuit integration.
Figure 18:
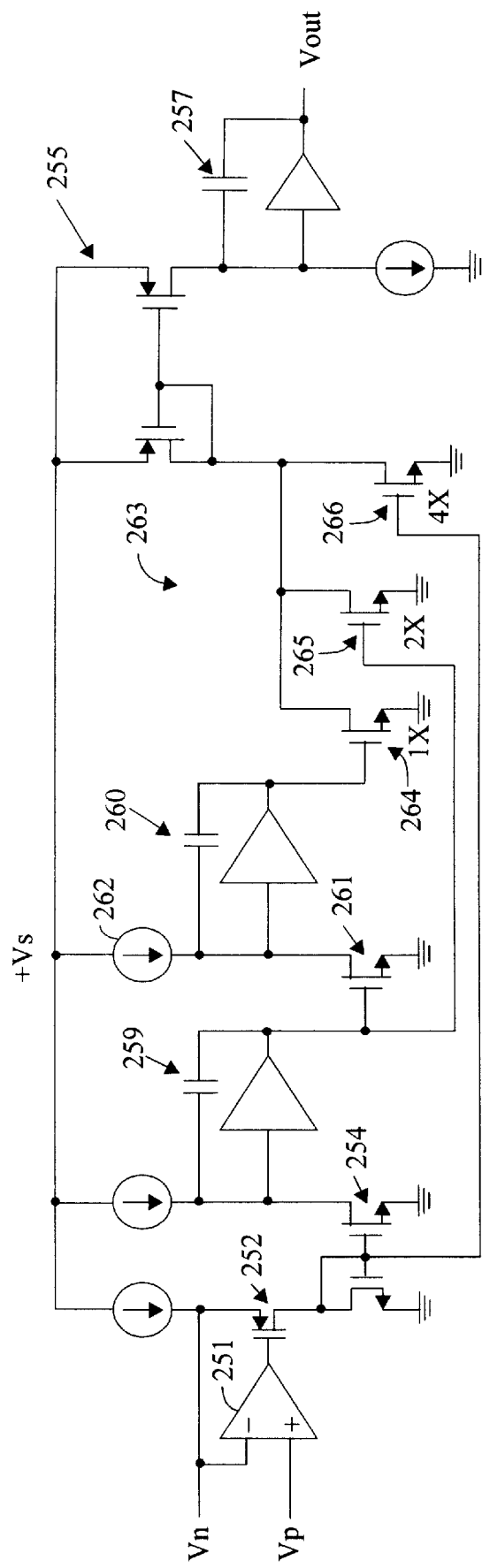
FIG. 18 is an alternative construction for a current feedback operational amplifier in which additional integrators and bypass paths are placed between a source follower feedback current input and the output stage.

Referring to FIG. 17, there is shown a current feedback operational amplifier similar to the operational amplifier in FIG. 15 but somewhat different in order to facilitate single-chip CMOS circuit integration. The operational amplifier includes an input stage differential amplifier 241, a P-channel source follower 242, a current source 243 sourcing current to the source of the source follower 242, a current mirror 244 reflecting the drain current of the source follower 242, a second current mirror 245 further reflecting the drain current, a current sink 246 for the current mirror 245, and an output stage integrator 247 for integrating the reflected current.

The differential amplifier 241 in FIG. 17 could be a conditionally-stable operational amplifier. For example, the differential amplifier 241 in FIG. 17 could comprise stages 41 to 44 of the circuit in FIG. 5, and the source follower 224 and integrator 223 could be part of the output stage 45 of the circuit in FIG. 5. However, it is preferred to construct a current feedback operational amplifier as shown in FIG. 17 in which an input differential amplifier 251 is unconditionally stable and additional integrators are inserted between a source follower 252 and an output stage integrator 257. For example, a second stage integrator 259 is inserted after the first current mirror 254, and a third stage integrator 260 is coupled to the second stage integrator 259 via a transconductor including an N-channel FET 261 and a current source 262. A three-input current summer generally designated 263 sums output signals from the first stage current mirror 254, the second stage integrator 259, and the third stage integrator 260. The summer 263 includes three N-channel FET transistors 264, 265, and 266 providing current to an output stage current mirror 255, and having different sizes for different saturation currents. The saturation currents for the more direct paths from the signal input to the signal output are greater than the saturation currents for the less direct paths.

In the more general embodiment, a current feedback amplifier is used for the underlying architecture. The input circuitry of a current feedback amplifier creates an output current that is integrated. This underlying architecture is improved by additional integrators and bypass paths around the additional integrators. While the principles of the architecture remain similar, the signal representation by a current is different. The voltage to current conversion of the transconductors is removed where a current is to be integrated, and a current mirror for duplication of the signal is added where a current is to be integrated by several integrators.

Preferably the additional integrators are inserted in the low-frequency path from the current feedback input to the signal output, so that the transimpedance from the current feedback input $V_n$ to the signal output $V_{out}$ has a phase lag of at least 180 degrees for a frequency in excess of the unity gain frequency of the operational amplifier. The additional low-frequency gain from the current feedback input to the signal output improves the linearity and accuracy of the operational amplifier when the operational amplifier is used in a feedback circuit. For example, the circuit of FIG. 17, when used with a resistive voltage divider having resistances $R_f$ and $R_b$, would have a much smaller low-frequency small-signal feedback current into the current feedback input $V_n$ than the circuit of FIG. 15, so that the low-frequency signal gain $V_{in}/V_{out}$ for the circuit in FIG. 17 would be more accurately set by the resistances $R_f$ and $R_b$.

Figure 19:
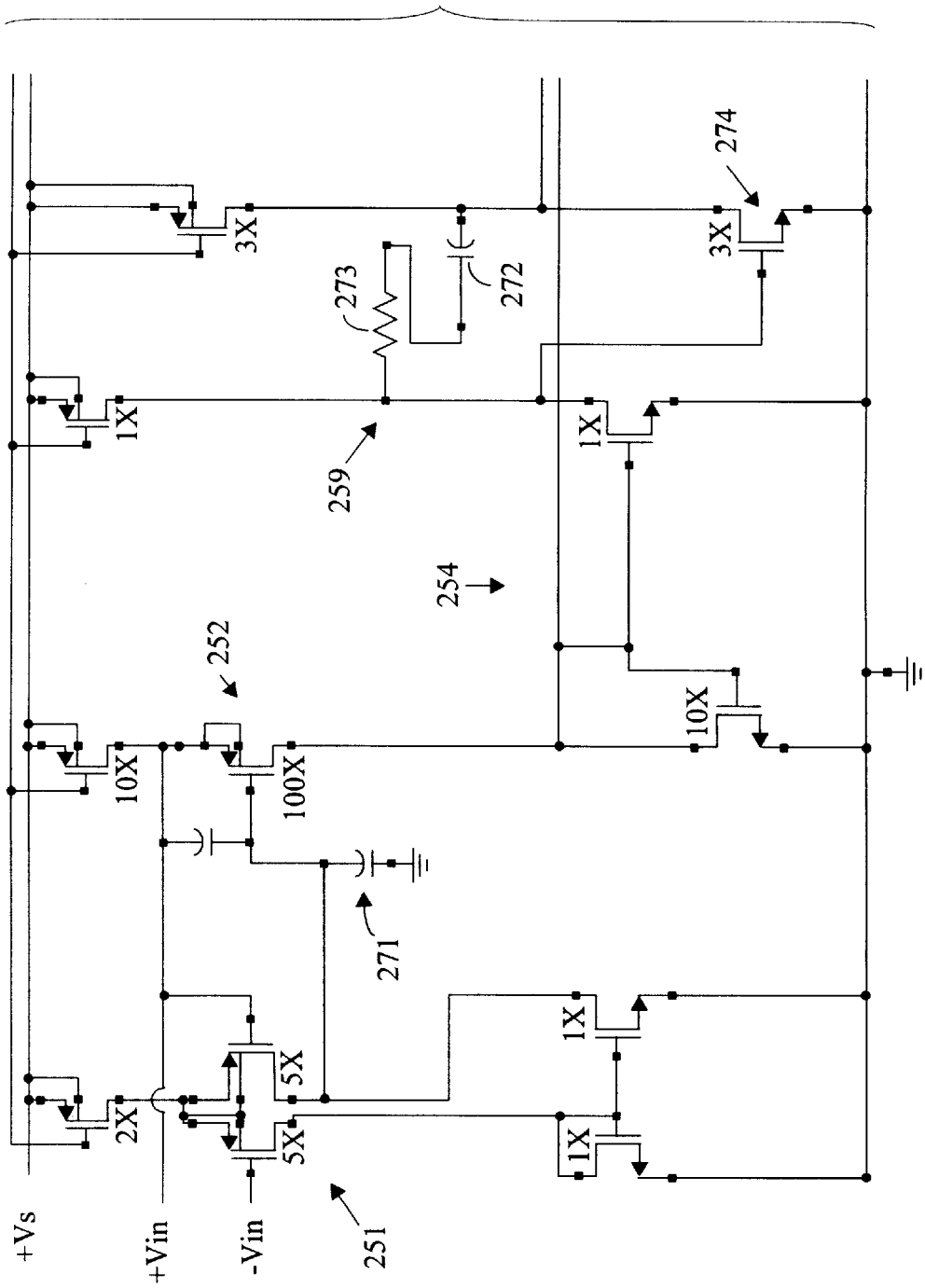
FIG. 19 is a first portion of a schematic diagram of a specific implementation for the circuit of FIG. 18.
Figure 20:
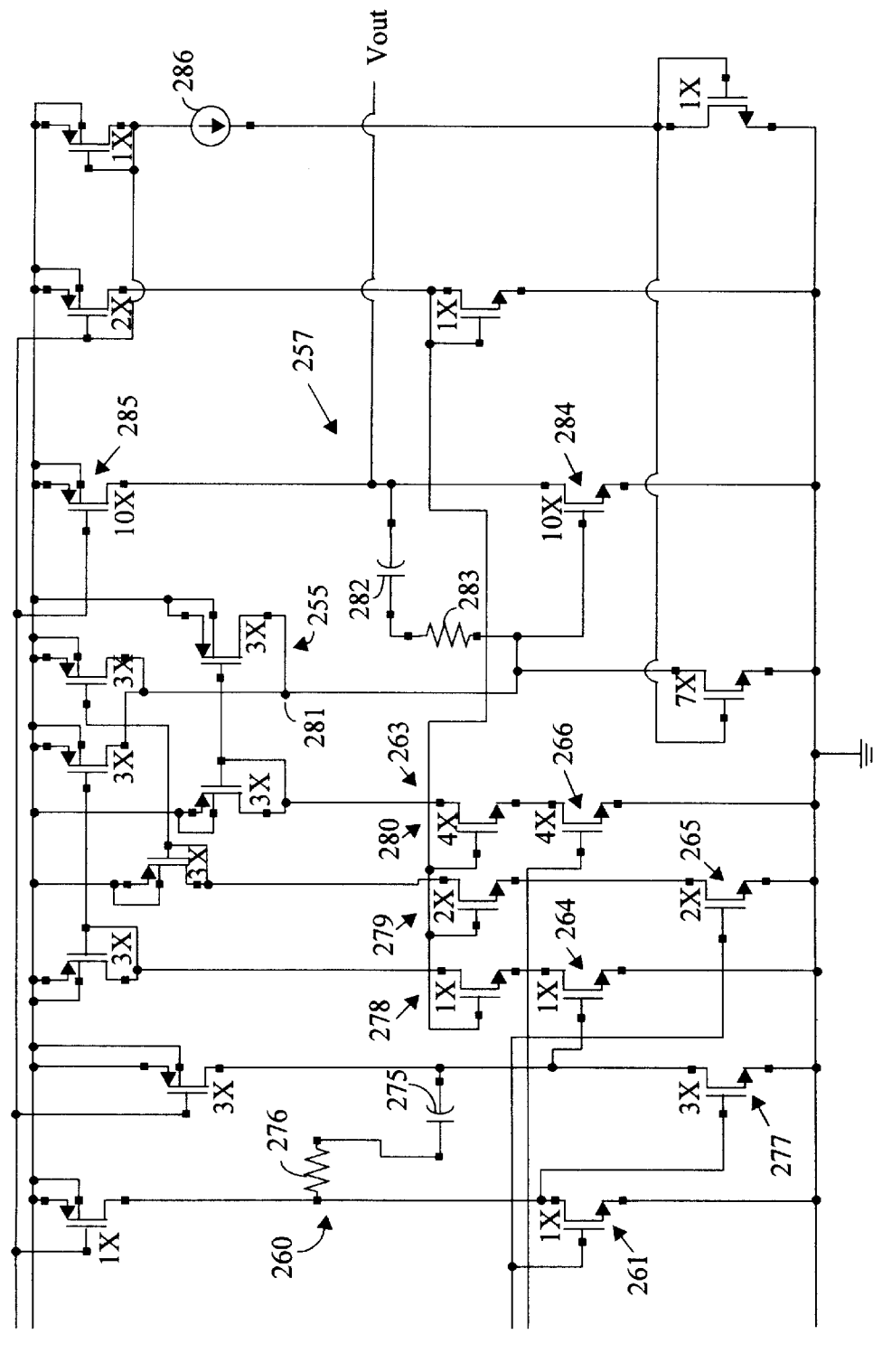
FIG. 20 is the second half of the circuit begun in FIG. 19.

Referring to FIGS. 19 and 20, there is shown a specific embodiment of the circuit of FIG. 17. The first stage differential amplifier 251 has an integrator capacitor 271 shunting the gate of the source follower 252 to ground. The second stage integrator 259 includes an integrator capacitor 272 in series with a resistor 273. The resistor 273 is optional, and it could help remove the phase shift caused by the capacitor 272 at high frequencies. An N-channel transistor 274 provides the gain for the second stage integrator. In a similar fashion, the third stage integrator includes a capacitor 275, an optional resistor 276, and an N-channel transistor 277.

The current summer 263 includes cascode N-channel transistors 278, 279, and 280 of sizes 1X, 2X, and 4X. These cascode transistors 278, 279, and 280 function in combination with their respective current sink transistors 264, 265, 266 to more precisely define respective saturation currents such that the saturation value of current sinked by the transistor 265 is twice the saturation value of current sinked by the transistor 264, and the saturation value of current sinked by the transistor 266 is four times the saturation value of current sinked by the transistor 264. The current mirror 255 to the output stage includes a separate respective mirror for each of the current summing transistors 264, 265, and 266. The actual summing occurs on an output node of 281 of the current mirror 255.

The output stage 257 includes an integration capacitor 282 in series with a resistor 283. Gain for the output stage is provided by an N-channel current sink transistor 284 and a P-channel current source transistor 285. The current source and sink levels in the operational amplifier are set by a current source 286. It is desirable for the bias current to be proportional to absolute temperature in order to reduce the temperature variation of MOSFET transconductance.

Figure 21:
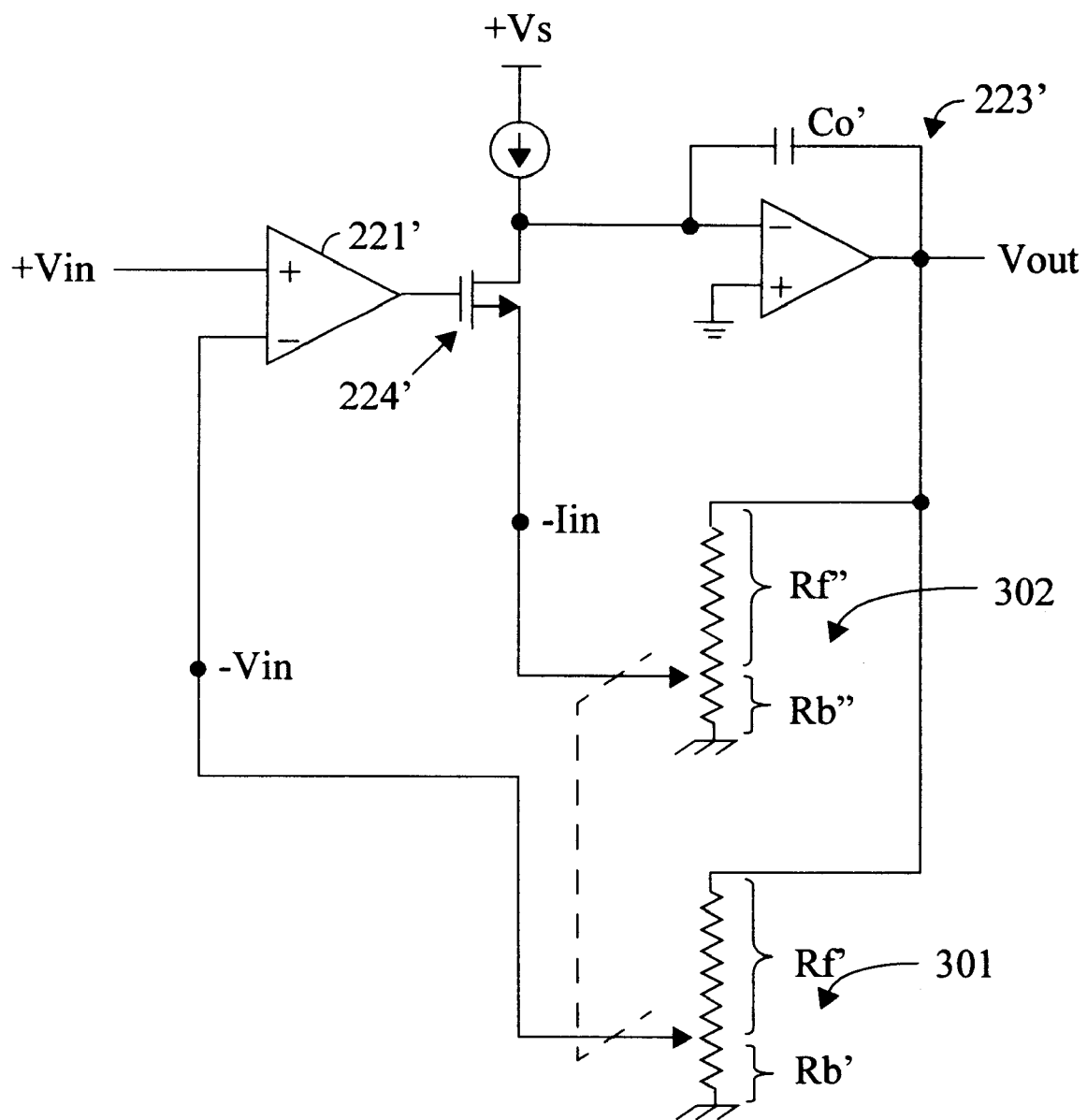
FIG. 21 is a schematic diagram of an operational amplifier having independent voltage feedback and current feedback inputs and separate feedback circuits from the operational amplifier output to the voltage feedback and current feedback inputs.

Referring to FIG. 21, there is shown a modification of the circuit of FIG. 15 that has a voltage feedback input $-V_{in}$ and a current feedback input $-I_{in}$ that is independent of the voltage feedback input. The current feedback is applied to the output stage and its high-frequency path, and the voltage feedback is applied to the input stage and the low-frequency path. The low-frequency path behavior is therefore dominated by the voltage feedback, and the input stage, chopping circuits, and buffers of intermediate stages are not complicated by current feedback inputs.

Components in FIG. 21 that are similar to the components in FIG. 15 are designated with similar but primed reference numerals. The voltage feedback input $-V_{in}$ receives a voltage feedback signal from a first voltage divider 301 excited by the output signal $V_{out}$, and the current feedback input $-I_{in}$ receives a current feedback signal from a second voltage divider 302 that is independent of the first voltage divider 301 and is also excited by the output signal $V_{out}$.

In the circuit of FIG. 21, the differential amplifier 221' can be a high-order conditionally-stable amplifier, and the voltage dividers 301, 302 can adjust both the open loop gain and the closed loop gain by substantially the same amount so that the closed-loop bandwidth is substantially constant and the stability of the operational amplifier is substantially unaffected by the gain change. In contrast to the circuit of FIG. 15, however, the voltage feedback input $-V_{in}$ is substantially isolated from non-linearities of the relatively low-impedance current feedback input $-I_{in}$, since these two feedback inputs receive feedback signals from separate feedback networks. Consequently, the operational amplifier circuit of FIG. 21 can achieve very high accuracy, as if it used only voltage feedback and no current feedback. In short, the operational amplifier circuit of FIG. 21 exploits the advantages of voltage feedback and current feedback without the relative disadvantages of either voltage feedback or current feedback.

The closed-loop gain is primarily adjusted by the first voltage divider 301, and the open-loop gain is primarily adjusted by the second voltage divider 302. To obtain substantially equal adjustments, the ratio of resistance $R_f''/R_b''$ should always be substantially equal to the ratio of resistance $R_f'/R_b'$. It is not necessary for $R_f''$ to be substantially equal to $R_f'$ or for $R_b''$ to be substantially equal to $R_b'$. For low thermal noise and low power consumption, for example, the first voltage divider 301 can have a lower resistance than the second voltage divider 302.

To adjust the ratios $R_f''/R_b''$ and $R_f'/R_b'$ by the same amount, the first and second voltage dividers 301, 302 could be mechanically ganged potentiometers. For an operational amplifier embedded in a more complex single-chip integrated circuit, however, it is preferred for the first and second voltage dividers to be electronically controlled potentiometers or step attenuators responsive to the same digital control signal.

Figure 22:
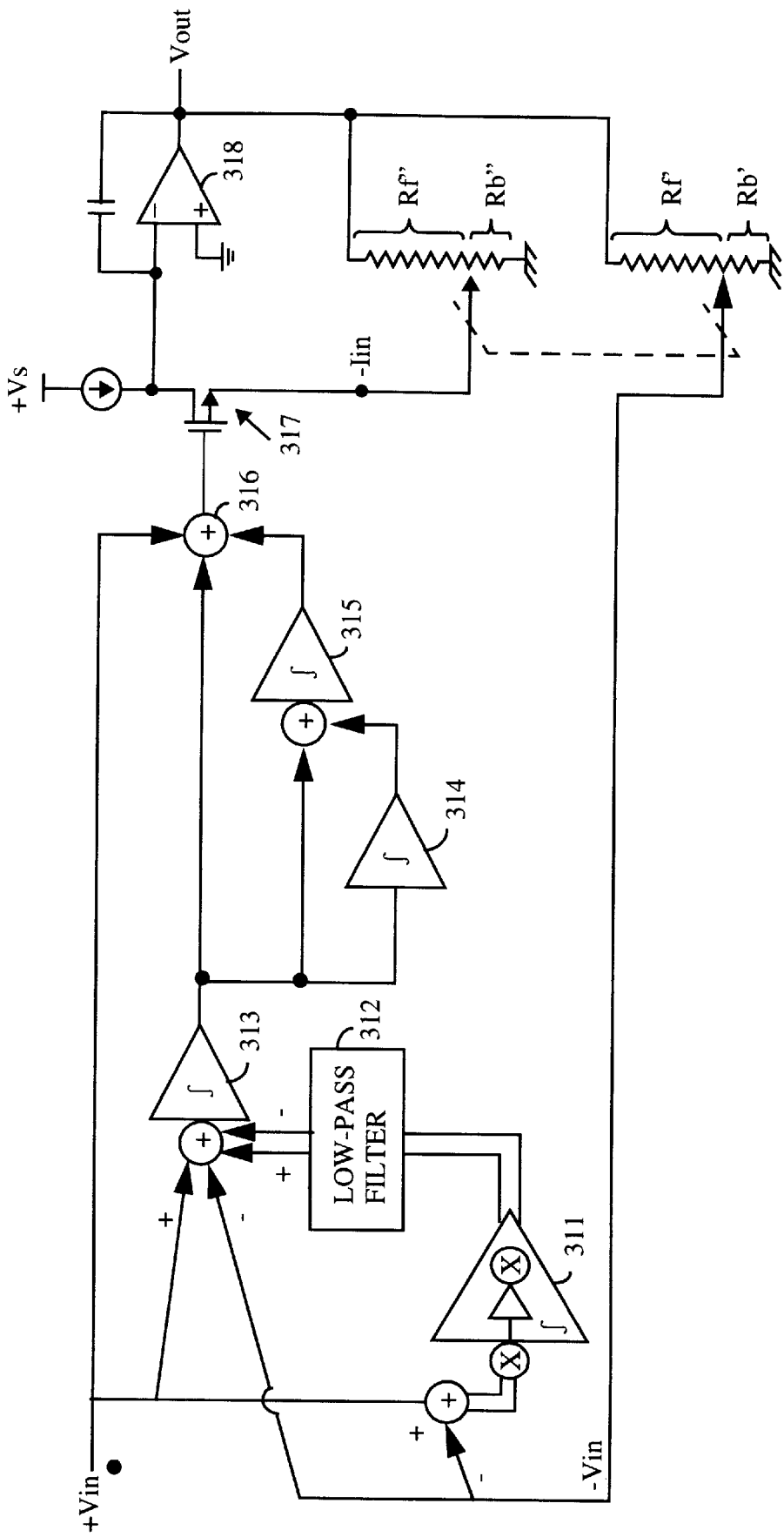
FIG. 22 is a detailed schematic diagram for a first implementation of the operational amplifier introduced in FIG. 21.

Referring to FIG. 22, there is a detailed schematic diagram for a first implementation of the operational amplifier introduced in FIG. 21. In this implementation, the low-frequency path includes a chopper-stabilized first integrator stage 311, a low-pass filter 312, a second integrator stage 313, a third integrator stage 314, a fourth integrator stage 315, an output stage summer 316, a source follower 317 providing a current feedback input $-I_{in}$, and an output stage amplifier 318. The operational amplifier in FIG. 22 is conditionally stabilized by multiple bypass paths using the architecture described above in FIG. 5, and the circuits for the chopper-stabilized first integrator stage 311, low-pass filter 312, second integrator stage 313, third integrator stage 314, and fourth integrator stage 315 could be similar to the circuits shown in the detailed schematics of FIGS. 2 and 10–12. The summer 316, source follower 317, and output amplifier 318 could be implemented using circuits similar to those shown in FIGS. 17 to 20. In this case the voltage feedback input $-V_{in}$ is received by the negative inputs of first stage 311 and the summer 319 just preceding the second stage integrator 313. However, the output of the second stage integrator 313 could be single-ended, and the third stage integrator 314 and the fourth stage integrator 315 could also be single-ended. The third stage integrator 314 and the fourth stage integrator 215, for example, could be constructed using intermediate integrator stage circuitry similar to that shown in the left-hand side of FIG. 20.

Figure 23:
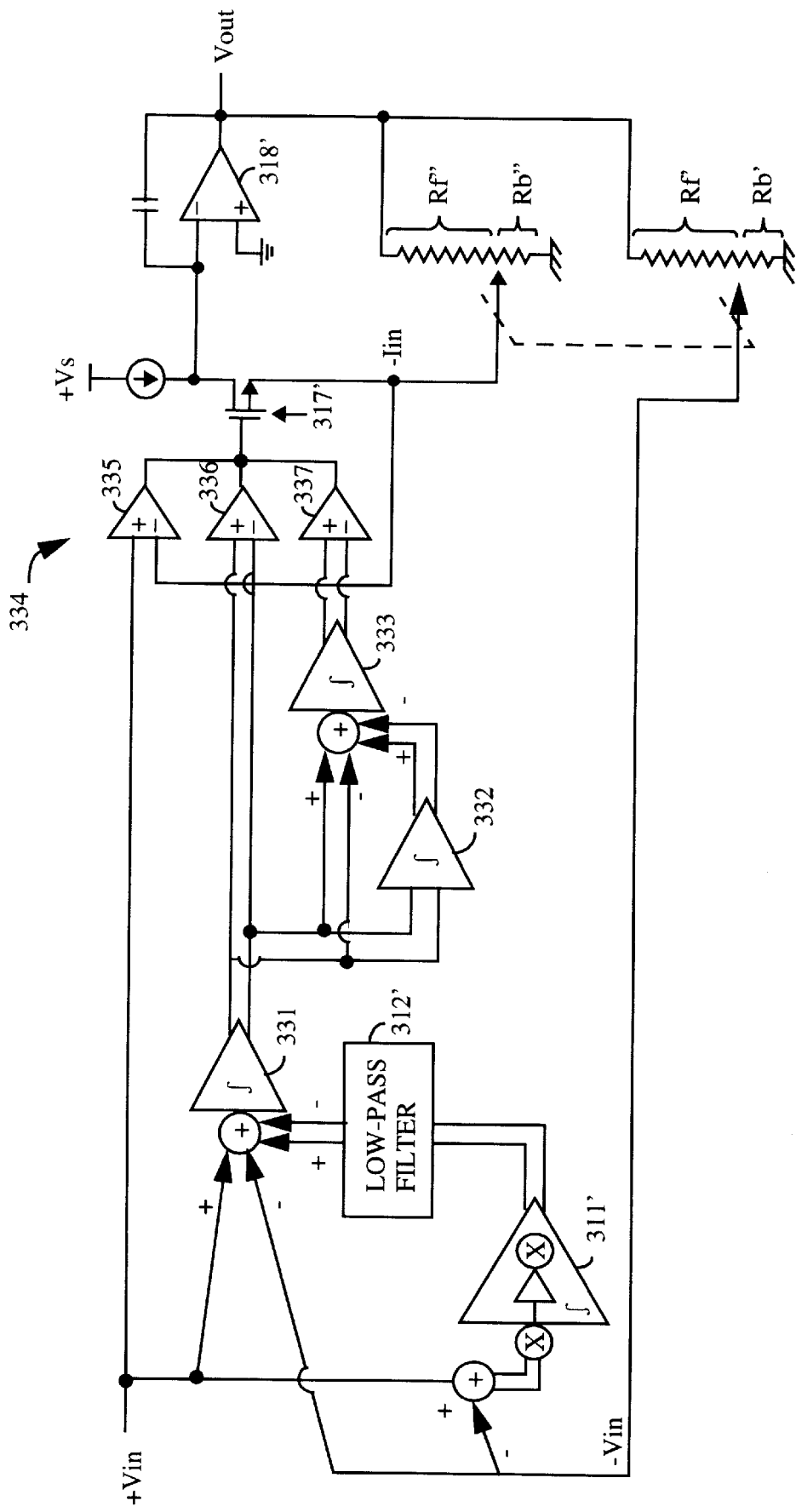
FIG. 23 is a detailed schematic diagram for a second implementation of the operational amplifier introduced in FIG. 21.

Alternatively, the output of the second stage integrator 313 could be differential, and the third stage integrator 314 and the fourth stage integrator 315 could be differential. An example of such differential circuitry is shown in FIG. 23. Components in FIG. 23 that are similar to components in FIG. 22 are designated with similar but primed reference numerals. The circuit of FIG. 23 includes a fully differential second stage integrator 331, third stage integrator 332, and fourth stage integrator 333, which could use the specific circuitry of FIGS. 2 and 12. The circuitry of FIG. 23 also includes an output stage summer 334 using differential amplifiers 335, 336, and 337 similar to the differential amplifiers 193, 192 and 191 of FIG. 13. In order to ensure that the current feedback input $-I_{in}$ has a relatively low impedance, however, the negative input of the differential amplifier 335 is connected directly to the current feedback input $-I_{in}$ instead of the voltage feedback input $-V_{in}$.

As described above, voltage offset of a differential amplifier in the first stage integrator has been reduced by chopper stabilization. However, persons skilled in the art recognize that other circuitry for dynamic offset reduction could be used in lieu of chopper circuitry. In general, such circuitry for dynamic offset reduction uses at least one clock signal, and undesirable artifacts from the clock signal appear in the output of the first stage integrator. Therefore, the use of such circuitry for dynamic offset reduction in a conditionally-stable operational amplifier presents the same problems of instability and low-pass filtering of artifacts that have been addressed above with respect to chopper stabilization.

Implementation details regarding circuitry for various kinds of dynamic offset reduction that could be used in lieu of chopper stabilization are described in Christian C. Enz et al., "Circuit Techniques for Reducing the Effects of Op-Amp Imperfections: Autozeroing, Correlated Double Sampling, and Chopper Stabilization," Proceedings of the IEEE, Vol. 84, No. 11, November 1996, pp. 1584–1614, incorporated herein by reference. Aside from chopper stabilization, perhaps auto-zeroing is the most popular technique.

Figure 24:
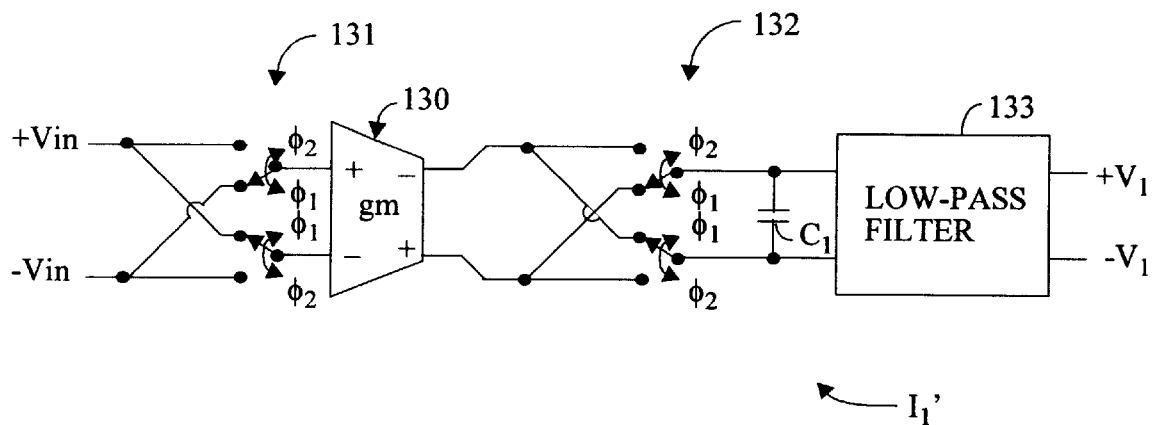
FIG. 24 is a generalized schematic diagram of a chopper-stabilized first integrator stage and an associated analog low-pass filter.
Figure 25:
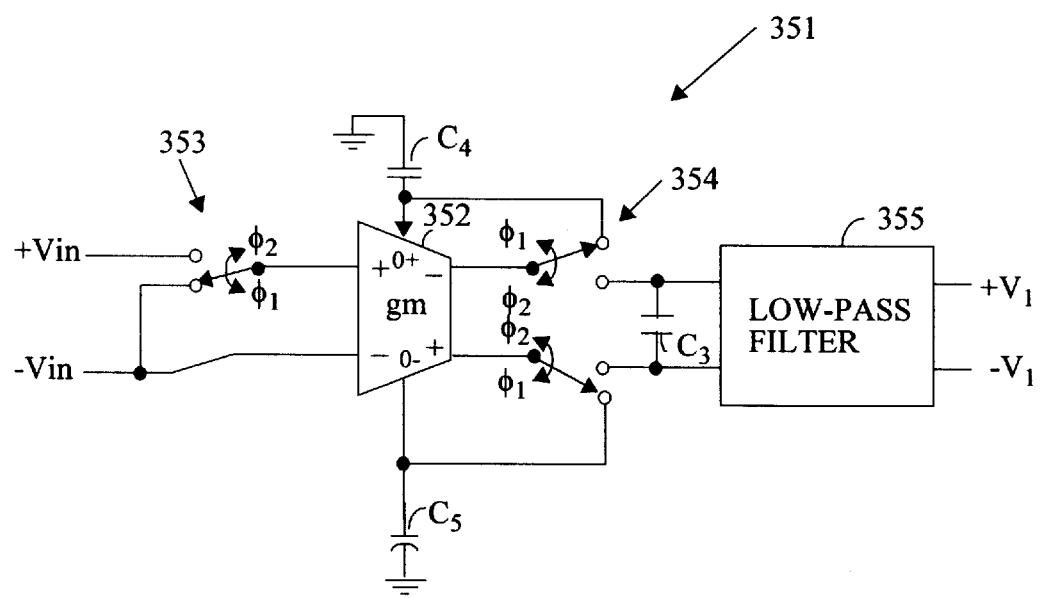
FIG. 25 is a schematic diagram of a first integrator stage having an auto-zero circuit and an associated analog low-pass filter.
Figure 26:
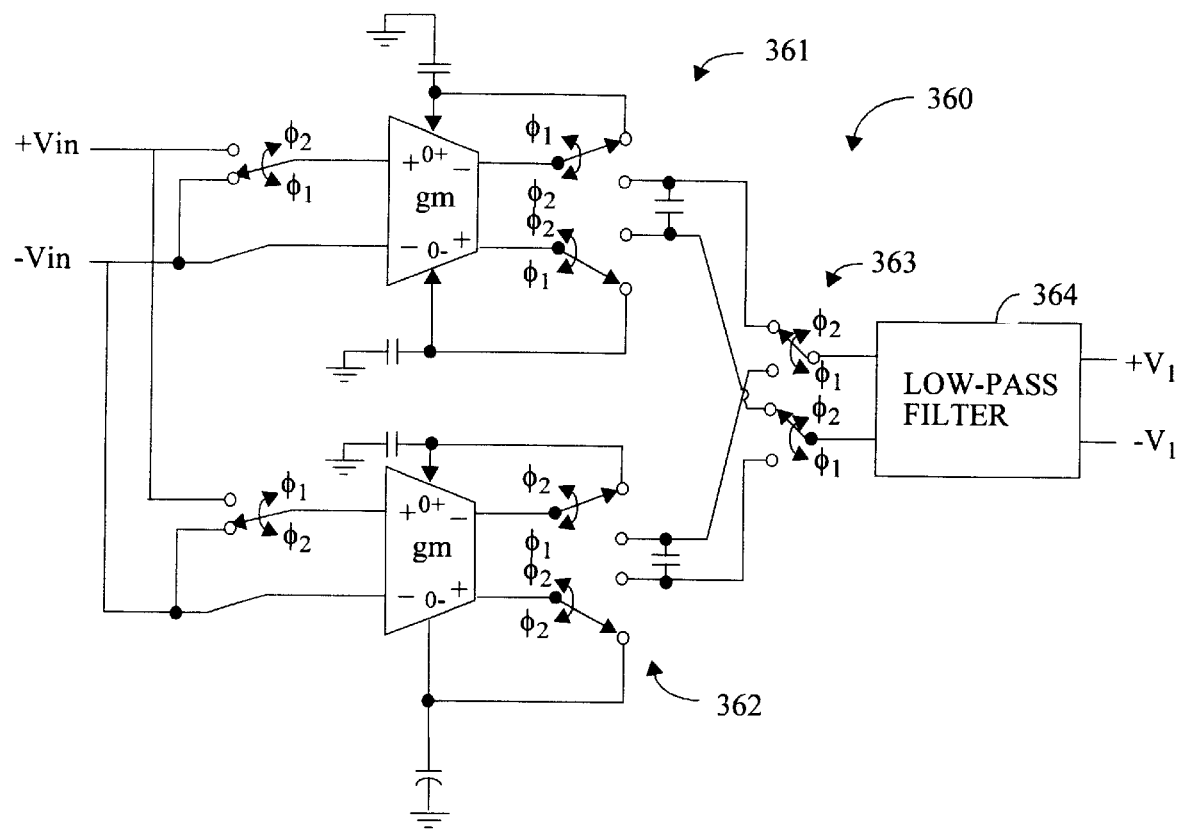
FIG. 26 is a schematic diagram of a first integrator stage having a time-interleaved auto-zero circuit and an associated analog low-pass filter.

FIGS. 24–26 illustrate similarities and differences between the chopper stabilization circuitry described above with respect to FIG. 10 and auto-zeroing circuitry that could be substituted for this chopper stabilization circuitry. For comparison purposes, the chopper stabilization circuitry is depicted in a more general form in the schematic of FIG. 24, which shows the differential amplifier 130 as a simple transconductor block ($g_m$). The input chopper 131 and output chopper 132 are shown as collections of switches controlled by synchronized and non-overlapping clock signals $\Phi_1$ and $\Phi_2$. A capacitor $C_1$ represents the integration capacitance for the first integrator stage 41.

FIG. 25 shows a first stage integrator stage 351 that uses auto-zeroing instead of chopper stabilization. The first integrator stage 351 is similar in that it has a differential amplifier 352, a set of input switches 353, a set of output switches 354, and integration capacitance $C_3$. The switches 353, 354 are again controlled by synchronized and non-overlapping clock signals $\Phi_1$ and $\Phi_2$, and artifacts related to the clocking frequency appear in the output of the first integrator stage 351. Therefore, the first integrator stage 351 is followed by a similar low-pass filter 355.

In contrast to the chopper-stabilization circuitry of FIG. 24, the auto-zero circuitry of FIG. 25 has the input switches 353 and output switches 355 configured so that during a phase interval when the clock $\Phi_1$ is asserted, the positive and negative inputs of the differential amplifier 352 are shorted together, and at this time output switches direct the output of the differential amplifier to capacitors $C_4$ and $C_5$ that hold offset control voltages that are applied to offset adjustment inputs (o+ and o–) of the differential amplifier 352.

The auto-zero circuitry of FIG. 25 produces rather severe artifacts because no signal is applied to the integration capacitance $C_3$ when the positive and negative inputs of the differential amplifier 352 are shorted together. This problem can be solved by duplicating the auto-zero circuitry for operation in a time-interleaved or "ping-pong" fashion. As shown in FIG. 26, a first integrator stage 360 using the time-interleaved auto-zero technique includes a first auto-zeroed integrator 361 and a second auto-zeroed integrator 362. Each of the first and second auto-zeroed integrators 361 and 362 is similar to the auto-zeroed integrator 351 of FIG. 25. The inputs of the first and second auto-zeroed integrators 361 and 362 are connected in parallel to the inputs $+V_{in}$ and $-V_{in}$ of the first stage integrator 360. However, the input connections and phasing of the input switches are selected so that when one of the auto-zeroed integrators 361, 362 has its positive and negative inputs shorted together, the other one of the auto-zeroed integrators 361, 362 is active in integrating the signal from the inputs $+V_{in}$ and $-V_{in}$ of the first stage integrator 360. A final set of output switches 363 combines the outputs of the first and second auto-zeroed integrators 361, 362 for filtering by a low-pass filter 364. As shown in FIG. 26, the clock signals $\Phi_1$ and $\Phi_2$ control the final output switches 363 so that when one of the first or second auto-zeroed integrators 361, 362 is active in integrating the signal from the inputs $+V_{in}$ and $-V_{in}$ of the first stage integrator 360, only the output of that integrator is transmitted to the low-pass filter 364.

In view of the above, there have been described the solutions to a number of related problems associated with high-order conditionally-stable operational amplifiers. Persons of ordinary skill in the art recognize that these solutions are applicable to a variety of circuit architectures. For example, the circuit of FIG. 1 could be modified by using a chopper-stabilized differential amplifier in the first integrator stage 21 and a low-pass filter inserted between the first integrator stage 21 and the first summer 31. In a similar fashion, the circuit of FIG. 5 could be modified to have one or more feedback paths similar to the optional path 15 in FIG. 1 to provide resonators.

Figure 27:
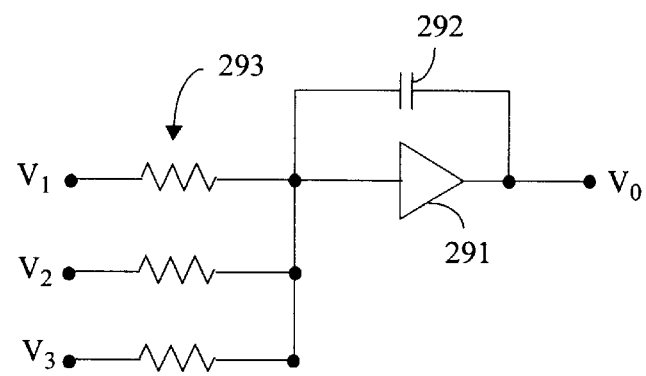
FIG. 27 is a schematic diagram of an integrator having a plurality of wideband summing inputs.

Although the preferred embodiments have focused on the use of transconductors and capacitors that are easily fabricated in CMOS integrated circuits, persons of ordinary skill recognize that other implementation technologies, such as bipolar integrated circuits, may employ different structures to achieve signal summation, integration, and current feedback inputs. For example, FIG. 27 shows an integrator structure including an inverting amplifier 291, a feedback capacitor 292, and a plurality of input resistors 293 to provide three summer inputs. The use of resistor networks for wideband summation instead of summing currents from transconductors may be more appropriate for bipolar technologies.

The preferred embodiments have focused on operational amplifiers designed to achieve precision noise gain in multistage signal processing such as a preamplifier or analog interface for an analog-to-digital converter. However, the invention is suitable not only for discrete and general purpose op-amp integrated circuits but also for embedded applications such as gain boosts or supertransistors or other small circuit blocks found inside more complex single-chip analog or mixed-signal integrated circuits.

What is claimed is:

1. An amplifier comprising, in combination:
   at least three integrator stages connected to provide a low-frequency path from a signal input to a signal output; and
   a relatively high-frequency bypass path from the signal input to the signal output for bypassing a first one of the integrator stages in the low-frequency path;
   wherein the first one of the integrator stages includes a differential amplifier and a dynamic offset reduction circuit connected to the differential amplifier to provide a reduction in differential offset voltage of the first one of the integrator stages.

2. The amplifier as claimed in claim 1, wherein the dynamic offset reduction circuit includes at least one chopper for chopper-stabilizing the differential amplifier.

3. The amplifier as claimed in claim 1, wherein the dynamic offset reduction circuit has a clock input for accepting at least one clock signal and produces undesirable artifacts from said clock signal, and further including an analog low-pass filter connected to the first one of the integrator stages to prevent the undesirable artifacts from passing from the first one of the integrator stages to the signal output.

4. The amplifier as claimed in claim 3, wherein the analog low-pass filter is inserted into the low-frequency path between the first one of the integrator stages and the second one of the integrator stages, and the analog low-pass filter introduces substantial attenuation into the low-frequency path at zero frequency.

5. The amplifier as claimed in claim 4, wherein the analog low-pass filter includes a differential amplifier having differential outputs and a gain substantially less than one, and capacitance shunting the differential outputs.

6. The amplifier as claimed in claim 4, wherein the relatively high-frequency bypass path includes the second one of the integrator stages, and the analog low-pass filter has a 3-dB cutoff frequency no less than a frequency at which signal gain through the low-frequency path from the signal input to the second one of the integrator stages is equal to signal gain through the relatively high-frequency bypass path from the signal input to the second one of the integrator stages.

7. The amplifier as claimed in claim 3, wherein the analog low-pass filter is inserted into the low-frequency path between the first one of the integrator stages and the second one of the integrator stages, the relatively high-frequency bypass path includes the second one of the integrator stages but does not include the analog low-pass filter, and further including an intermediate bypass path from the signal output to the analog low-pass filter for additional bypassing of the first integrator stage.

8. The amplifier as claimed in claim 3, wherein the relatively high-frequency bypass path extends from the signal input to a last one of the integrator stages in the low-frequency path and bypasses all of the integrator stages in the low-frequency path except for the last one of the integrator stages in the low-frequency path.

9. The amplifier as claimed in claim 1, further comprising a feedback path to an input of one of the integrators in the low-frequency path from an output of an integrator in the low-frequency path immediately following said one of the integrators in the low-frequency path.

10. The amplifier as claimed in claim 1, wherein the low-frequency path and the relatively high-frequency path converge at a current summing node combining current from a current source in the low-frequency path with current from a current source in the relatively high-frequency path, the current source in the relatively high-frequency path having a first saturation current limit, and the current source in the low-frequency path having a second saturation current limit, wherein the first and second saturation current limits have values so that the relatively high-frequency path is not saturated when the low-frequency path saturates.

11. The amplifier as claimed in claim 10, wherein the current source in the relatively high-frequency path is a first differential amplifier having a common mode current having a magnitude substantially equal to the first saturation current limit, and the current source in the low-frequency path is a second differential amplifier having a common mode current having a magnitude substantially equal to the second saturation current limit.

12. The amplifier as claimed in claim 10, wherein the current source in the relatively high-frequency path is a first field-effect transistor, the current source in the low-frequency path is a second field-effect transistor, and the first field-effect transistor has a substantially higher transconductance than the second field-effect transistor.

13. The amplifier as claimed in claim 1, further including a current feedback input, and wherein the conditionally-stable operational amplifier has an open-loop gain inversely proportional to resistance presented at the current feedback input.

14. The amplifier as claimed in claim 13, wherein the relatively high-frequency path includes a controlled voltage source applying a voltage to the current feedback input, the voltage being responsive to a signal on the signal input, and an output stage applying an output signal to the signal output in response to current flow through the resistance presented at the current feedback input.

15. The amplifier as claimed in claim 14, wherein the controlled voltage source is a transistor follower circuit having a voltage follower output at the current feedback input.

16. The amplifier as claimed in claim 13, further including a voltage feedback input substantially independent of the current feedback input, the voltage feedback input providing voltage feedback to a first one of the integrator stages in the low-frequency path, and the current feedback input providing current feedback to an output stage in the relatively high-frequency path.

17. A conditionally-stable multipath operational amplifier comprising, in combination:
   at least three integrator stages connected to provide a low-frequency path from a signal input to a signal output; and
   a relatively high-frequency bypass path from the signal input to a last one of the integrator stages in the low-frequency path; and
   an intermediate bypass path from the signal input to a second one of the integrator stages in the low-frequency path for bypassing a first one of the integrator stages in the relatively low-frequency path;

wherein the first one of the integrator stages includes a differential amplifier and a dynamic offset reduction circuit connected to the differential amplifier to provide a reduction in differential offset voltage of the first one of the integrator stages; and further comprising an analog low-pass filter in the low-frequency path between the differential amplifier and the second one of the integrator stages to prevent artifacts of dynamic offset reduction from reaching the second one of the integrator stages.

18. The conditionally-stable multipath operational amplifier as claimed in claim 17, wherein the analog low-pass filter introduces substantial attenuation into the low-frequency path at zero frequency.

19. The conditionally-stable multipath operational amplifier as claimed in claim 17, wherein the analog low-pass filter is at least a third-order analog low-pass filter.

20. A conditionally-stable operational amplifier comprising, in combination:

at least three integrator stages connected to provide a low-frequency path from a signal input to a signal output; and a relatively high-frequency bypass path for bypassing at least one of the integrator stages in the low-frequency path;

wherein the low-frequency path and the relatively high-frequency path converge at a current summing node combining current from a current source in the low-frequency path with current from a current source in the relatively high-frequency path, the current source in the relatively high-frequency path having a first saturation current limit, the current source in the low-frequency path having a second saturation current limit, and the first and second saturation current limits have values so that the relatively high-frequency path is not saturated when the low-frequency path saturates.

21. The conditionally-stable operational amplifier as claimed in claim 20, wherein the second saturation current limit is substantially less than the first saturation current limit.

22. The conditionally-stable operational amplifier as claimed in claim 20, wherein the current source in the relatively high-frequency path is a first differential amplifier having a common mode current having a magnitude substantially equal to the first saturation current limit, and the current source in the low-frequency path is a second differential amplifier having a common mode current having a magnitude substantially equal to the second saturation current limit.

23. The conditionally-stable operational amplifier as claimed in claim 20, wherein the current source in the relatively high-frequency path is a first field-effect transistor, the current source in the low-frequency path is a second field-effect transistor, and the first field-effect transistor has a substantially higher transconductance than the second field-effect transistor.

24. The conditionally-stable operational amplifier as claimed in claim 20, further including a current feedback input, wherein the conditionally-stable operational amplifier has an open-loop gain inversely proportional to resistance presented at the current feedback input.

25. The conditionally-stable operational amplifier as claimed in claim 24, wherein the relatively high-frequency path includes a controlled voltage source applying a voltage to the current feedback input, the voltage being responsive to a signal on the signal input, and an output stage applying an output signal to the signal output in response to current through the resistance presented at the current feedback input.

26. The conditionally-stable operational amplifier as claimed in claim 25, wherein the controlled voltage source is a transistor follower circuit having a voltage follower output at the current feedback input.

27. The conditionally-stable operational amplifier as claimed in claim 20, further comprising a feedback path to an input of one of the integrators in the low-frequency path from an output of an integrator in the low-frequency path immediately following said one of the integrators in the low-frequency path.

28. A conditionally-stable operational amplifier comprising a signal input, a signal output, a gain stage in a signal path from the signal input to the signal output, and a current feedback input, wherein the gain stage is responsive to the current feedback input to assert an output signal on the signal output in response to current received at the current feedback input, wherein the conditionally-stable operational amplifier has an open-loop unity gain frequency for unity gain from said signal input to said signal output, the conditionally-stable operational amplifier has at least 180 degrees of phase lag from said signal input to said signal output for a frequency less than the open-loop unity gain frequency, and the phase lag from said signal input to said signal output decreases to less than 180 degrees as frequency increases to the open-loop unity gain frequency.

29. The conditionally-stable operational amplifier as claimed in claim 28, further including a controlled voltage source in the signal path for applying a voltage to the current feedback input in response to an input signal on the signal input.

30. The conditionally-stable operational amplifier as claimed in claim 29, wherein the controlled voltage source includes a differential amplifier having a feedback input connected to the current feedback input so that the controlled voltage source applies to the current feedback input a voltage responsive to a difference between the input signal on the signal input and the voltage applied to the current feedback input.

31. A conditionally-stable operational amplifier comprising a signal input, a signal output, a gain stage in a signal path from the signal input to the signal output, and a current feedback input, wherein the gain stage is responsive to the current feedback input to assert an output signal on the signal output in response to current received at the current feedback input, further including a controlled voltage source in the signal path for applying a voltage to the current feedback input in response to an input signal on the signal input, and wherein the conditionally-stable operational amplifier includes a low-frequency path from the signal input to the controlled voltage source, the low-frequency path includes a series of at least two integrator stages connected between the signal input and the controlled voltage source, and the conditionally-stable operational amplifier further includes a relatively high-frequency bypass path from the signal input to the controlled voltage source for bypassing said at least two integrator stages.

32. A conditionally-stable operational amplifier comprising a signal input, a signal output, a gain stage in a signal path from the signal input to the signal output, and a current feedback input, wherein the gain stage is responsive to the current feedback input to assert an output signal on the signal output in response to current received at the current feedback input, and wherein the conditionally-stable operational amplifier includes a low frequency path from the signal input to the signal output, the low-frequency path includes at least one integrator stage connected between the signal input and the controlled voltage source, and said at least one integrator stage includes a voltage feedback input substantially independent of said current feedback input.

33. The conditionally-stable operational amplifier as claimed in claim 32, further including a first feedback circuit connected from said signal output to said voltage feedback input, and a second feedback circuit connected from said signal output to said current feedback input.

34. The conditionally-stable operational amplifier as claimed in claim 33, wherein said first feedback circuit and said second feedback circuit are adjustable and are coupled for adjustment of feedback of said second feedback circuit from said signal input to said current feedback input substantially in proportion to adjustment of feedback of said first feedback circuit from said signal input to said voltage feedback input.

35. The conditionally-stable operational amplifier as claimed in claim 29, wherein the controlled voltage source includes a transistor in a voltage follower stage, said current received at the current feedback input passing through said transistor in a path to the output stage.

36. A conditionally-stable operational amplifier comprising a signal input, a signal output, a gain stage in a signal path from the signal input to the signal output, and a current feedback input, wherein the gain stage is responsive to the current feedback input to assert an output signal on the signal output in response to current received at the current feedback input, wherein the output stage asserts a voltage on the signal output in proportion to current received at the current feedback input, the conditionally-stable operational amplifier has a unity gain frequency for unity gain from said signal input to said signal output, and wherein the conditionally-stable operational amplifier has a transimpedance from the current input to the signal output that has a phase lag of more than 180 degrees from the current output to the current input for a frequency substantially less than said unity gain frequency.

37. The conditionally-stable operational amplifier as claimed in claim 36, further including at least two integrator stages in a low-frequency path from said current feedback input to said output stage, and a relatively high-frequency path from said current feedback input to said output stage for bypassing said at least two integrator stages.

38. A conditionally-stable operational amplifier comprising, in combination:
 a voltage signal input;
 at least three integrator stages connected to provide a low-frequency path from the voltage signal input to a signal output;
 a relatively high-frequency bypass path for bypassing at least one of the integrator stages in the low-frequency path;
 a current feedback input; and
 a shunt resistance from the current feedback input to a signal ground, wherein the conditionally-stable operational amplifier has an open-loop gain from said voltage signal input to said signal output inversely proportional to said shunt resistance.

39. A conditionally-stable operational amplifier comprising, in combination:
 at least three integrator stages connected to provide a low-frequency path from a signal input to a signal output;
 a relatively high-frequency bypass path for bypassing at least one of the integrator stages in the low-frequency path; and
 a current feedback input, wherein the conditionally-stable operational amplifier has an open-loop gain inversely proportional to resistance presented at the current feedback input;
 wherein the relatively high-frequency path includes a controlled voltage source applying a voltage to the current feedback input, the voltage being responsive to a signal on the signal input, and an output stage applying an output signal to the signal output in response to current flow through the resistance presented at the current feedback input.

40. The conditionally-stable operational amplifier as claimed in claim 39, wherein the controlled voltage source includes a differential amplifier having a feedback input connected to the current feedback input for applying to the current feedback input a voltage responsive to a difference between the input signal on the signal input and the voltage applied by the controlled voltage source to the current feedback input.

41. The conditionally-stable operational amplifier as claimed in claim 39, wherein at least one of the integrator stages are connected in the low-frequency path from the signal input to the controlled voltage source, and said at least one of the integrator stages includes a voltage feedback input substantially independent of said current feedback input.

42. The conditionally-stable operational amplifier as claimed in claim 41, further including a first feedback circuit connected from said signal output to said voltage feedback input, and a second feedback circuit connected from said signal output to said current feedback input.

43. The conditionally-stable operational amplifier as claimed in claim 42, wherein said first feedback circuit and said second feedback circuit are adjustable and are coupled for adjustment of feedback of said second feedback circuit from said signal input to said current feedback input substantially in proportion to adjustment of feedback of said first feedback circuit from said signal input to said voltage feedback input.

44. The conditionally-stable operational amplifier as claimed in claim 39, wherein the relatively high-frequency path includes a transistor follower circuit having a voltage follower output at the current feedback input.

45. A conditionally-stable operational amplifier comprising, in combination:
 at least three integrator stages connected to provide a low-frequency path from a signal input to a signal output;
 a relatively high-frequency bypass path for bypassing at least one of the integrator stages in the low-frequency path;
 wherein a first one of said integrator stages has a differential amplifier including inputs that are positive and negative in polarity with respect to the signal output at zero frequency, the differential amplifier producing a difference signal responsive to a difference in voltage between the positive and negative inputs of the differential amplifier; and further including a current feedback input in the high-frequency path connected to the differential amplifier to assert a voltage on the current feedback input responsive to the difference signal of the differential amplifier; and wherein a last one of the integrator stages in the low-frequency path is responsive to current flowing from said current feedback input.

46. The conditionally-stable operational amplifier as claimed in claim 45, wherein the negative input of the differential amplifier is connected to the current feedback input so that the voltage on the current feedback input is proportional to a difference between voltage on the positive input of the differential amplifier and the voltage on the current feedback input.

47. The conditionally-stable operational amplifier as claimed in claim 45, further including a first feedback circuit connected from said signal output to the negative input of the differential amplifier, and a second feedback circuit connected from said signal output to said current feedback input.

48. The conditionally-stable operational amplifier as claimed in claim 47, wherein said first feedback circuit and said second feedback circuit are adjustable and are coupled for adjustment of feedback of said second feedback circuit from said signal input to said current feedback input substantially in proportion to adjustment of feedback of said first feedback circuit from said signal input to the negative input of the differential amplifier.

49. The conditionally-stable operational amplifier as claimed in claim 45, which includes a transistor follower in the relatively high-frequency bypass path, the transistor follower receiving the difference signal from the differential amplifier, having a voltage follower output at the current feedback input, and conducting current integrated by the last one of the integrator stages.

50. The conditionally-stable operational amplifier as claimed in claim 45, further including at least one intermediate integrator stage in a portion of the low-frequency path from the current feedback input to the last stage in the low-frequency path, wherein the intermediate integrator stage is bypassed by the relatively high-frequency path.

51. The conditionally-stable operational amplifier as claimed in claim 45, further including at least two intermediate integrator stages in a portion of the low-frequency path from the current feedback input to the last stage in the low-frequency path, wherein the intermediate integrator stages are bypassed by the relatively high-frequency path, and only one of the two intermediate integrator stages is further bypassed by an intermediate bypass path conveying a signal from another of the two intermediate integrator stages.

52. An amplifier circuit comprising, in combination:
a conditionally-stable operational amplifier having a signal input, a negative feedback input, and a signal output; and
a resistor feedback network connecting the negative feedback input to the signal output for applying to the negative feedback input a fraction of a signal from the signal output;
wherein the conditionally-stable operational amplifier includes a signal path from the signal input to the signal output including an amplifier stage having a differential amplifier for amplifying a difference between an input signal from the signal input and a feedback signal from the negative feedback input, and a dynamic offset reduction circuit connected to the differential amplifier to provide a reduction in differential offset voltage of the amplifier stage; and
wherein the conditionally-stable operational amplifier has an open-loop unit and frequency for unity gain from said signal input to said signal output, the conditionally-stable operational amplifier has at least 180 decrees of phase lap from said signal input to said signal output for a frequency less than the open-loop unity gain frequency, and the phase lag from said signal input to said signal output decreases to less than 180 degrees as frequency increases to the open-loop unity gain frequency.

53. An amplifier circuit comprising, in combination:
a conditionally-stable operational amplifier having a signal input, a negative feedback input, and a signal output; and
a resistor feedback network connecting the negative feedback input to the signal output for applying to the negative feedback input a fraction of a signal from the signal output;
wherein the conditionally-stable operational amplifier includes a signal path from the signal input to the signal output including an amplifier stage having a differential amplifier for amplifying a difference between an input signal from the signal input and a feedback signal from the negative feedback input, and a dynamic offset reduction circuit connected to the differential amplifier to provide a reduction in differential offset voltage of the amplifier stage; and
wherein the resistor feedback network is adjustable to adjust the fraction of the signal from the signal output which is applied to the negative feedback input.

54. An amplifier circuit comprising, in combination:
a conditionally-stable operational amplifier having a signal input, a negative feedback input, and a signal output; and
a resistor feedback network connecting the negative feedback input to the signal output for applying to the negative feedback input a fraction of a signal from the signal output;
wherein the conditionally-stable operational amplifier includes a signal path from the signal input to the signal output including an amplifier stage having, a differential amplifier for amplifying a difference between an input signal from the signal input and a feedback signal from the negative feedback input, and a dynamic offset reduction circuit connected to the differential amplifier to provide a reduction in differential offset voltage of the amplifier stage; and
wherein the dynamic offset reduction circuit includes at least one chopper for chopper-stabilizing the differential amplifier.

55. An amplifier circuit comprising in combination:
a conditionally-stable operational amplifier having a signal input, a negative feedback input, and a signal output; and
a resistor feedback network connecting the negative feedback input to the signal output for applying to the negative feedback input a fraction of a signal from the signal output;
wherein the conditionally-stable operational amplifier includes a signal path from the signal input to the signal output including an amplifier stage having a differential amplifier for amplifying a difference between an input signal from the signal input and a feedback signal from the negative feedback input, and a dynamic offset reduction circuit connected to the differential amplifier to provide a reduction in differential offset voltage of the amplifier stage, and wherein the dynamic offset reduction circuit has a clock input for accepting at least one clock signal and produces undesirable artifacts from said clock signal, and further including an analog low-pass filter connected to the differential amplifier to prevent the undesirable artifacts from passing from the dynamic offset reduction circuit to the signal output.

56. An amplifier circuit comprising, in combination:

a conditionally-stable operational amplifier having a signal input, a negative feedback input, and a signal output; and a resistor feedback network connecting the negative feedback input to the signal output for applying to the negative feedback input a fraction of a signal from the signal output;

wherein the conditionally-stable operational amplifier includes a signal path from the signal input to the signal output including an amplifier stage having a differential amplifier for amplifying a difference between an input signal from the signal input and a feedback signal from the negative feedback input, and a dynamic offset reduction circuit connected to the differential amplifier to provide a reduction in differential offset voltage of the amplifier stage, and further including a bypass path from the negative feedback input to the signal output for bypassing the differential amplifier, the bypass path merging at a summing node with a low-frequency path from the differential amplifier to the signal output, the summing node combining a signal from a first signal source in the bypass path with a signal from a second signal source in the low-frequency path, the first signal source having a first saturation limit, the second signal source having a second saturation limit, and the first and second saturation limits having values so that the bypass path is not saturated when the low-frequency path saturates.

57. The amplifier circuit as claimed in claim 56, wherein the first signal source is a first current source, and the second signal source is a second current source, and the summing node combines current from the first current source with current from the second current source.

58. The amplifier circuit as claimed in claim 57, wherein the current source in the bypass path is a first differential amplifier having a common mode current having a magnitude substantially equal to the first saturation limit, and the current source in the low-frequency path is a second differential amplifier having a common mode current having a magnitude substantially equal to the second saturation limit.

59. The amplifier circuit as claimed in claim 57, wherein the current source in the bypass path is a first field-effect transistor, the current source in the low-frequency path is a second field-effect transistor, and the first field-effect transistor has a substantially higher transconductance than the second field-effect transistor.

60. An amplifier circuit comprising, in combination:

a conditionally-stable operational amplifier having a signal input, a negative feedback input, and a signal output; and a resistor feedback network connecting the negative feedback input to the signal output for applying to the negative feedback input a fraction of a signal from the signal output;

wherein the conditionally-stable operational amplifier includes a signal path from the signal input to the signal output including an amplifier stage having a differential amplifier for amplifying a difference between an input signal from the signal input and a feedback signal from the negative feedback input, and a dynamic offset reduction circuit connected to the differential amplifier to provide a reduction in differential offset voltage of the amplifier stage, and wherein the negative feedback input is a current feedback input, and wherein the conditionally-stable operational amplifier has an open-loop gain inversely proportional to resistance presented by the resistor feedback network to the current feedback input.

61. The amplifier circuit as claimed in claim 60, wherein the conditionally-stable operational amplifier includes a controlled voltage source applying a voltage to the current feedback input, the voltage being responsive to a signal on the signal input, and an output stage applying an output signal to the signal output in response to current flow through the resistance presented by the resistor feedback network to the current feedback input.

62. An amplifier circuit comprising, in combination:

a conditionally-stable operational amplifier having a signal input, a negative feedback input, and a signal output; and a resistor feedback network connecting the negative feedback input to the signal output for applying to the negative feedback input a fraction of a signal from the signal output;

wherein the conditionally-stable operational amplifier includes at least three integrator stages connected to provide a low-frequency path from a signal input to a signal output; and a relatively high-frequency bypass path for bypassing at least one of the integrator stages in the low-frequency path;

wherein the low-frequency path and the relatively high-frequency path converge at a summing node combining a signal from a first signal source in the low-frequency path with a signal from a second signal source in the relatively high-frequency path, the first signal source has a first saturation limit, the second signal source has a second saturation limit, and the first and second saturation limits have values so that the relatively high-frequency path is not saturated when the low-frequency path saturates.

63. The amplifier circuit as claimed in claim 62, wherein the first signal source is a first current source, and the second signal source is a second current source, and the summing node combines current from the first current source with current from the second current source.

64. The amplifier circuit as claimed in claim 63, wherein the current source in the relatively high-frequency path is a first differential amplifier having a common mode current having a magnitude substantially equal to the first saturation limit, and the current source in the low-frequency path is a second differential amplifier having a common mode current having a magnitude substantially equal to the second saturation limit.

65. The amplifier circuit as claimed in claim 63, wherein the current source in the relatively high-frequency path is a first field-effect transistor, the current source in the low-frequency path is a second field-effect transistor, and the first field-effect transistor has a substantially higher transconductance than the second field-effect transistor.

66. A method of amplifying a signal, comprising the steps of:
(a) passing a first portion of the signal through at least three integrator stages in a low-frequency path from a signal input to a signal output, a first one of the integrator stages in the low-frequency path including a differential amplifier that amplifies the signal before passing the signal to a next one of the integrator stages in the low-frequency path; and
passing a second portion of the signal through a bypass path from the signal input to the signal output for bypassing the first one of the integrator stages in the low-frequency path;
wherein the method further includes dynamically reducing offset of the first one of the integrator stages in response to at least one clock signal.

67. The method as claimed in claim 66, wherein the offset of the first one of the integrator stages is dynamically reduced by chopping the first portion of the signal before the first portion of the signal is amplified by the differential amplifier and demodulating the amplified signal before the amplified signal is passed to the next one of the integrator stages.

68. The method as claimed in claim 66, which further includes low-pass filtering the amplified signal from the differential amplifier in an analog low-pass filter to attenuate artifacts of dynamic offset reduction before the amplified and demodulated signal is received by a second one of the integrator stages.

69. The method as claimed in claim 68, which further includes attenuating the signal from the first integrator stage at zero frequency before combining the signal from the first integrator stage with the portion of the signal conveyed in the bypass path.

70. The method as claimed in claim 69, wherein the signal from the first integrator stage is combined with the portion of the signal conveyed by the bypass path to produce a combined signal received by the second one of the integrator stages.

71. The method as claimed in claim 66, wherein the signal from the first integrator stage is combined with the portion of the signal conveyed by the bypass path by converting the signal from the first integrator stage to a first current limited to a first saturation current level, converting the portion of the signal conveyed by the bypass path to a second current limited to a second saturation current level, the first and second saturation current levels having been preset so that saturation in the low-frequency path occurs before saturation in the bypass path, and summing the first current with the second current to produce a combined current signal.

72. The method as claimed in claim 66, which includes:
converting at least a portion of the signal in the operational amplifier to a voltage applied to a current feedback input;
producing, in a resistance connected to the current feedback input, a current substantially proportional to the voltage applied to the current feedback input; and
producing, at the signal output, an output signal responsive to said current substantially proportional to the voltage applied to the current feedback input.

73. A method of amplifying a signal, comprising the steps of:
(a) passing a first portion of the signal through at least three integrator stages in a low-frequency path from a signal input to a signal output;
(b) passing a second portion of the signal through a bypass path around at least one of the integrator stages in the low-frequency path; and
(c) combining the first portion of the signal passing from said at least one of the integrator stages with the second portion of the signal passing from the bypass path to produce a combined signal that is passed to the signal output;
wherein the first portion of the signal passing from said at least one of the integrator stages is combined with the second portion of the signal passing from the bypass path by
(i) converting the first portion of the signal from said at least one of the integrator stages to a first current limited to a first saturation current level,
(ii) converting the second portion of the signal conveyed by the bypass path to a second current limited to a second saturation current level, the first and second saturation current levels having been preset so that saturation in the low-frequency path occurs before saturation in the bypass path, and
(iii) summing the first current with the second current to produce a combined current.

74. The method as claimed in claim 73, which includes:
converting at least a portion of the signal in the operational amplifier to a voltage applied to a current feedback input;
producing, in a resistance connected to the current feedback input, a current substantially proportional to the voltage applied to the current feedback input; and
producing, at the signal output, an output signal responsive to said current substantially proportional to the voltage applied to the current feedback input.

75. A method of amplifying a signal using a conditionally-stable operational amplifier having at least three integrator stages in a low-frequency path from a signal input to a signal output and having a bypass path for effectively bypassing at least one of the integrators at a relatively high frequency, said method comprising the steps of:
(a) applying the signal to the signal input;
(b) converting the signal in the operational amplifier to a voltage applied to a current feedback input;
(c) producing, in a resistance connected to the current feedback input, a current substantially proportional to the voltage applied to the current feedback input; and
(d) producing, at the signal output, an output signal responsive to said current substantially proportional to the voltage applied to the current feedback input;
wherein the method includes passing at least a portion of the signal through the bypass path around said at least one of the integrators at a relatively high frequency.

76. The method as claimed in claim 75, wherein the current feedback input is at a location in the low-frequency path that is not bypassed by the bypass path.

77. The method as claimed in claim 75, wherein the current feedback input is at a location in the low-frequency path, said at least one integrator is in the low-frequency path between the current feedback input and the signal output, and the bypass path extends from the current feedback input and bypasses said at least one integrator in the low-frequency path between the current feedback input and the signal output.

78. The method as claimed in claim 75, wherein the voltage produced at the current feedback input is substantially proportional to a difference between the signal applied to the signal input and the voltage produced at the current feedback input.

79. A method of adjusting gain of a conditionally-stable operational amplifier having a signal input, a signal output, a voltage feedback input, a first feedback network from the signal output to the voltage feedback input, a current feedback input, and a second feedback network from the signal output to the current feedback input, said method comprising the steps of:

a) adjusting the first feedback network for a first amount of voltage feedback from the signal output to the voltage feedback input, and adjusting the second feedback network for a first amount of current feedback from the signal output to the current feedback input; and b) re-adjusting the first feedback network for a second amount of voltage feedback from the signal output to the voltage feedback input, and re-adjusting the second feedback network for a second amount of current feedback from the signal output to the current feedback input, wherein the voltage feedback and the current feedback are adjusted in a substantially proportional fashion.

80. The method as claimed in claim 79, wherein the ratio of the second amount of voltage feedback to the first amount of voltage feedback is substantially equal to the ratio of the second amount of current feedback to the first amount of current feedback.

81. The method as claimed in claim 79, wherein the amount of voltage feedback sets a closed-loop gain of the conditionally-stable operational amplifier, and the amount of current feedback sets an open-loop gain of the conditionally-stable operational amplifier.

82. A signal processing system comprising, in combination, a conditionally-stable operational amplifier for amplifying an analog signal to produce an amplified analog signal;

a feedback network connected to the conditionally-stable operational amplifier for setting a closed-loop gain for the conditionally-stable operational amplifier; and an analog-to-digital converter for converting the amplified analog signal to a corresponding digital signal;

wherein the conditionally-stable operational amplifier includes at least three integrator stages connected to provide a low-frequency path from a signal input to a signal output, a relatively high-frequency bypass path from the signal input to the signal output for bypassing a first one of the integrator stages in the low-frequency path, and, in the first one of the integrator stages, a differential amplifier and a dynamic offset reduction circuit responsive to a clock signal and connected to the differential amplifier to provide a reduction in differential offset voltage of the first one of the integrator stages.

83. The signal processing system as claimed in claim 82, wherein the analog-to-digital converter is also responsive to a clock signal for controlling sampling and conversion of the amplified analog signal to produce the corresponding digital signal, and wherein the signal processing system includes a connection between the analog-to-digital converter and the conditionally-stable operational amplifier so that the dynamic offset reduction circuit operates in synchronism with the sampling and conversion by the analog-to-digital converter.

84. The signal processing system as claimed in claim 82, wherein the feedback network is adjustable for a plurality of predetermined closed-loop gain settings of the conditionally-stable operational amplifier.

85. A signal processing system for amplifying an analog differential signal including a first analog signal and a second analog signal, said system comprising, in combination:

a first conditionally-stable operational amplifier for amplifying the first analog signal to produce a first amplified analog signal, the first conditionally-stable operational amplifier having a first signal input for receiving the first analog signal, a first negative feedback input, and a first signal output for providing the first amplified analog signal;

a second conditionally-stable operational amplifier for amplifying the second analog signal to produce a second amplified analog signal, the second conditionally-stable operational amplifier having a second signal input for receiving the second analog signal, a second negative feedback input, and a second signal output for providing the second amplified analog signal;

a resistor feedback network connected between said first signal output and said second output and having a first node connected to said first negative feedback input and a second node connected to said second negative feedback input so that said first conditionally-stable operational amplifier has a first closed-loop gain for amplifying said first analog signal and said second conditionally-stable operational amplifier has a second closed loop gain for amplifying said second analog signal, said first closed-loop gain being substantially equal to said second closed-loop gain; and an analog-to-digital converter for converting the first amplified analog signal and the second amplified analog signal to a corresponding digital signal representing a difference between the first amplified analog signal and the second amplified analog signal;

wherein the first conditionally-stable operational amplifier includes a signal path from the first signal input to the first signal output including a first amplifier stage having a first differential amplifier for amplifying a difference between the first analog input signal from the first signal input and a first feedback signal from the first negative feedback input, and a first dynamic offset reduction circuit connected to the differential amplifier to provide a reduction in differential offset voltage of the first amplifier stage; and wherein the second conditionally-stable operational amplifier includes a signal path from the second signal input to the second signal output including a second amplifier stage having a second differential amplifier for amplifying a difference between the second analog input signal from the second signal input and a second feedback signal from the second negative feedback input, and a second dynamic offset reduction circuit connected to the differential amplifier to provide a reduction in differential offset voltage of the second amplifier stage.

86. The signal processing system as claimed in claim 85, wherein the analog-to-digital converter is responsive to the clock signal for controlling sampling and conversion of the first and second amplified analog signals to produce the corresponding digital signal, and wherein the signal processing system includes a connection between the analog-to-digital converter and the first and second conditionally-stable operational amplifiers so that the dynamic offset reduction circuit operates in synchronism with the sampling and conversion by the analog-to-digital converter.

87. The signal processing system as claimed in claim 85, wherein the resistor feedback network is adjustable for a plurality of predetermined closed-loop gain settings of the first and second conditionally-stable operational amplifiers.

88. The conditionally-stable operational amplifier as claimed in claim 28, which further includes a voltage feedback input, wherein the voltage feedback input and the signal input comprise a pair of differential voltage inputs for the conditionally-stable operational amplifier.

89. The conditionally-stable operational amplifier as claimed in claim 38, which further includes a voltage feedback input, wherein the voltage feedback input and the voltage signal input comprise a pair of differential voltage inputs for the conditionally-stable operational amplifier.

* * * * *